United States Patent
Himori et al.

(10) Patent No.: US 8,895,454 B2
(45) Date of Patent: Nov. 25, 2014

(54) ETCHING METHOD OF MULTILAYER FILM

(71) Applicant: Tokyo Electron Limited, Tokyo (JP)

(72) Inventors: Shinji Himori, Miyagi (JP); Etsuji Ito, Miyagi (JP); Akihiro Yokota, Miyagi (JP); Shu Kusano, Miyagi (JP); Hiroaki Ishizuka, Miyagi (JP); Kazuya Nagaseki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/158,981

(22) Filed: Jan. 20, 2014

(65) Prior Publication Data

US 2014/0206199 A1 Jul. 24, 2014

Related U.S. Application Data

(60) Provisional application No. 61/758,340, filed on Jan. 30, 2013.

(51) Int. Cl.
*H01L 21/302* (2006.01)
*H01L 21/311* (2006.01)

(52) U.S. Cl.
CPC ............... *H01L 21/31116* (2013.01)
USPC ....... 438/725; 438/689; 438/728; 156/345.26

(58) Field of Classification Search
USPC ............. 438/725, 728, 732, 689; 156/345.42, 156/334.46, 3, 45.51
See application file for complete search history.

(56) References Cited

FOREIGN PATENT DOCUMENTS

| JP | 4107518 B2 | 4/2008 |
|---|---|---|
| JP | 4107518 | * 6/2008 |

* cited by examiner

*Primary Examiner* — Duy Deo
*Assistant Examiner* — Maki Angadi
(74) *Attorney, Agent, or Firm* — Pearne & Gordon LLP

(57) ABSTRACT

In an etching method of a multilayer film including a first oxide film and a second oxide film, a high frequency power in etching an organic film is set to be higher than those in etching a first and second oxide films, and high frequency bias powers in the etching of the first and second oxide films are set to be higher than that in the etching of the organic film. In the etching of the first and second oxide films and the organic film, a magnetic field is generated such that horizontal magnetic field components in a radial direction with respect to a central axis line of a target object have an intensity distribution having a peak value at a position far from the central axis line, and a position of the peak value in the etching of the organic film is closer to the central axis line.

7 Claims, 21 Drawing Sheets

ETCHING METHOD OF MULTILAYER FILM

CROSS-REFERENCE TO RELATED APPLICATION

This application claims the benefit of Japanese Patent Application Nos. 2013-008504 and 2013-066465 filed on Jan. 21, 2013 and Mar. 27, 2013, respectively, and U.S. Provisional Application Ser. No. 61/758,340 filed on Jan. 30, 2013, the entire disclosures of which are incorporated herein by reference.

TECHNICAL FIELD

The embodiments described herein pertain generally to an etching method of a multilayer film.

BACKGROUND

A plasma etching technique for a target object is important in manufacturing devices. In the plasma etching technique, a plasma density distribution in a processing space needs to be controlled to adjust an etching rate distribution of a target object. As a technique of controlling a plasma density distribution, there has been known a technique of controlling a plasma density distribution by generating a magnetic field in a processing space where an electric field is formed. Such a technique is described in, for example, Patent Document 1.

A plasma processing apparatus described in Patent Document 1 is a parallel-plate type plasma processing apparatus including an upper electrode and a lower electrode. This plasma processing apparatus generates a magnetic field which is symmetric in a radial direction with respect to a central axis line of a target object, i.e. a wafer, in a processing space. To be specific, in the plasma processing apparatus described in Patent Document 1, a mounting table serving as the lower electrode is provided in the processing space and the wafer is mounted on the mounting table. A ceiling portion of a processing chamber, which partitions the processing space, serves as the upper electrode, and multiple permanent magnets are provided on an upper surface of the ceiling portion. The multiple permanent magnets are arranged along multiple concentric circles around the central axis line of the wafer and also arranged in the radial direction with respect to the central axis line. In the plasma processing apparatus, a vertical electric field is generated in the processing chamber, and by setting directions of magnetic poles of the multiple permanent magnets at the processing space side, a magnetic field distributed in a radial shape is generated in the processing space. Thus, electrons in plasma are subject to Lorentz force, and perform a drift motion to be revolved around the central axis line of the wafer. A speed of the drift motion is inversely proportion to intensity of horizontal magnetic field components in a radial direction with respect to the central axis line of the wafer. Therefore, in an area where the drift motion is performed at a low speed, a staying time of the electrons becomes long. In an area where a staying time of the electrons is long, dissociation of a processing gas becomes accelerated. As a result, a plasma density distribution in the processing space can be adjusted.

Patent Document 1: Japanese Patent Publication No. 4107518

Meanwhile, when etching a multilayer film formed of multiple films different from each other in a kind of a film and a thickness of a film, a high frequency power for plasma generation to be applied to an upper electrode or a lower electrode and/or a high frequency bias power for ion attraction to be applied to the lower electrode may be changed depending on a kind of a film and a thickness of a film. If the high frequency power and/or the high frequency bias power are changed, the plasma density distribution in the processing space is also changed.

However, in the plasma processing apparatus described in Patent Document 1, since the positions of the multiple permanent magnets are fixed, an intensity distribution of the horizontal magnetic field components cannot be adjusted. Therefore, in the multilayer film formed of multiple films different from each other in a kind of a film and a thickness of a film, when each of the multiple films is etched, a plasma density distribution cannot be adjusted. As a result, an etching rate of each film may be non-uniform in a radial direction from the center.

Under these circumstances, in this technical field, it has been demanded to suppress non-uniformity of an etching rate depending on a position when etching each film of a multilayer film.

SUMMARY

In one example embodiment, an etching method of a multilayer film is provided. This etching method is to etch the multilayer film including a first oxide film, a second oxide film, and an organic film formed between the first oxide film and the second oxide film in a plasma processing apparatus. In this etching method, a target object having the multilayer film and a resist mask formed on the first oxide film is accommodated in a processing space of the plasma processing apparatus. This etching method includes etching the first oxide film by generating plasma of a first processing gas in the processing space; etching the organic film by generating plasma of a second processing gas in the processing space after the etching of the first oxide film; and; and etching the second oxide film by generating plasma of a third processing gas in the processing space after the etching of the organic film. Here, each of the plasma of the first processing gas, the plasma of the second processing gas, and the plasma of the third processing gas is generated by applying a high frequency power to one of a lower electrode serving as a mounting table configured to mount thereon the target object and an upper electrode provided above the lower electrode. Further, in each of the etching of the first oxide film, the etching of the organic film, and the etching of the second oxide film, a high frequency bias power is applied to the lower electrode.

Since an underlying film of the organic film is the second oxide film, it is necessary to reduce damage to the second oxide film caused by the etching of the organic film. In order to reduce the damage to the second oxide film, the organic film may not be etched with ions having high energy, i.e. the organic film needs to be etched with a large amount of active species such as radicals while suppressing ions from being attracted toward the target object as far as possible. Meanwhile, when the first oxide film and the second oxide film are etched, it is desirable to accelerate the etching of the first oxide film and the etching of the second oxide film by ion attraction effect. Therefore, in the etching method, the high frequency power in the etching of the organic film is set to be higher than the high frequency power in the etching of the first oxide film and the high frequency power in the etching of the second oxide film. Further, in the etching method, the high frequency bias power in the etching of the first oxide film and the high frequency bias power in the etching of the second oxide film are set to be higher than the high frequency bias power in the etching of the organic film. Thus, in the etching of the organic film, since the high frequency power is high, a large amount of radicals are generated, and since the high frequency bias power is low, the organic film can be etched with low energy. Therefore, it is possible to suppress damage to the second oxide film. Further, since the high frequency bias power in the etching of the first oxide film and the high frequency bias power in the etching of the second oxide film are relatively high, it is possible to accelerate the etching of the first oxide film and the etching of the second oxide film by ion attraction effect.

Typically, a density of plasma generated by generating a high frequency electric field between the upper electrode and the lower electrode tends to be increased in an area closer to the central axis line of the target object. That is, there is formed a plasma density distribution having a gradient in which a plasma density is decreased as farther from the central axis line. As the high frequency power is increased, the gradient becomes steeper. Therefore, in the etching method, in the etching of the first oxide film, the etching of the organic film, and the etching of the second oxide film, a magnetic field is generated such that the horizontal magnetic field components in a radial direction with respect to the central axis line of the target object have an intensity distribution having a peak value at a position far from the central axis line. Further, in the etching method, in the etching of the organic film, a magnetic field is generated such that a position of the peak value of the horizontal magnetic field components is closer to the central axis line than a position of the peak value of the horizontal magnetic field components in the etching of the first oxide film and a position of the peak value of the horizontal magnetic field components in the etching of the second oxide film. As described above, in the etching method, in the etching of the first oxide film, the etching of the organic film and the etching of the second oxide film, since the magnetic field is generated such that the horizontal magnetic field components have an intensity distribution having a peak value at a position far from the central axis line, it is possible to decrease the gradient of the plasma density distribution. Further, a position of the peak value of the horizontal magnetic field components in the etching of the organic film is closer to the central axis line than a position of the peak value of the horizontal magnetic field components in the etching of the first oxide film and a position of the peak value of the horizontal magnetic field components in the etching of the second oxide film. Therefore, it is possible to decrease a steeper gradient of the plasma density distribution which can be generated in the etching of the organic film if such a magnetic field is not generated. Therefore, in the etching method, in the etching of the first oxide film, the etching of the organic film and the etching of the second oxide film, by reducing non-uniformity of the plasma density distribution, it is possible to suppress non-uniformity of an etching rate depending on a position when each film of the multilayer film is etched.

In the etching of the organic film, a position of a peak intensity of the horizontal magnetic field components may be an intermediate position between a center of the target object and an edge of the target object in the radial direction. Further, in the etching of the first oxide film and the etching of the second oxide film, a position of a peak intensity of the horizontal magnetic field components may be an outer position of an edge of the target object in the radial direction.

A thickness of the second oxide film may be greater than a thickness of the first oxide film, and the high frequency bias power in the etching of the second oxide film may be higher than the high frequency bias power in the etching of the first oxide film. Further, intensity of the horizontal magnetic field components in the etching of the second oxide film may be higher than intensity of the horizontal magnetic field components in the etching of the first oxide film. With this configuration, it is possible to suppress non-uniformity of an etching rate depending on a position when etching each film of the multilayer film, and also possible to increase an etching rate of the second oxide film having a greater thickness by ion attraction effect.

In another example embodiment, an etching method of a multilayer film is provided. In another example embodiment, the multilayer film includes at least a first film and a second film. Further, the etching method includes etching the first film by generating plasma of a processing gas in a processing space of a plasma processing apparatus in which a target object having the multilayer film is accommodated; and etching the second film by generating plasma of a processing gas in the processing space. Each of the plasma of the processing gas generated in the etching of the first film and the plasma of the processing gas generated in the etching of the second film is generated by applying a high frequency power to one of a lower electrode serving as a mounting table configured to mount thereon the target object and an upper electrode provided above the lower electrode, and the high frequency power in the etching of the second film is set to be higher than the high frequency power in the etching of the first film. Further, in each of the etching of the first film and the etching of the second film, a high frequency bias power is applied to the lower electrode, and the high frequency bias power in the etching of the first film is set to be higher than the high frequency bias power in the etching of the second film. Furthermore, in each of the etching of the first film and the etching of the second film, a magnetic field is generated such that horizontal magnetic field components in a radial direction with respect to a central axis line of the target object have an intensity distribution having a peak value at a position far from the central axis line, and a position of the peak value of the horizontal magnetic field components in the etching of the second film is closer to the central axis line than a position of the peak value of the horizontal magnetic field components in the etching of the first film.

In the etching method in accordance with another example embodiment, in the etching of the second film, a relatively higher high frequency power is used to generate plasma, and the second film is etched with a large amount of active species such as radicals. Meanwhile, in the etching of the first film, since a relatively lower high frequency power is used to generate plasma and a relatively higher high frequency bias power is used to attract ions toward the target object, the etching of the first film is accelerated. A plasma density distribution in the etching of the first film and a plasma density distribution in the etching of the second film have gradients in which a plasma density is decreased as farther from the central axis line, but since the high frequency power in the etching of the second film is relatively high, a gradient of the plasma density distribution in the etching of the second film is steeper than a gradient of the plasma density distribution in the etching of the first film. For this reason, in the etching method in accordance with another example embodiment, the magnetic field is generated such that a position of the peak value of the horizontal magnetic field components in the etching of the second film is closer to the central axis line than a position of the peak value of the horizontal magnetic field components in the etching of the first film. Thus, it is possible to decrease the gradient of the plasma density distribution. As a result, it is possible to suppress non-uniformity of an etching rate depending on a position when each film of the multilayer film is etched.

In the etching of the second film, a position of a peak intensity of the horizontal magnetic field components may be an intermediate position between a center of the target object and an edge of the target object in the radial direction. Further, in the etching of the first film, a position of a peak intensity of the horizontal magnetic field components may be an outer position of an edge of the target object in the radial direction.

As explained above, in accordance with the example embodiments, it is possible to suppress non-uniformity of an etching rate depending on a position when each film of the multilayer film is etched. The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent from the following detailed description. The use of the same reference numbers in different figures indicates similar or identical items.

FIGS. 10A and 1013 illustrate magnetic fields generated at block S1 and block S3;

DETAILED DESCRIPTION

Figure 1:
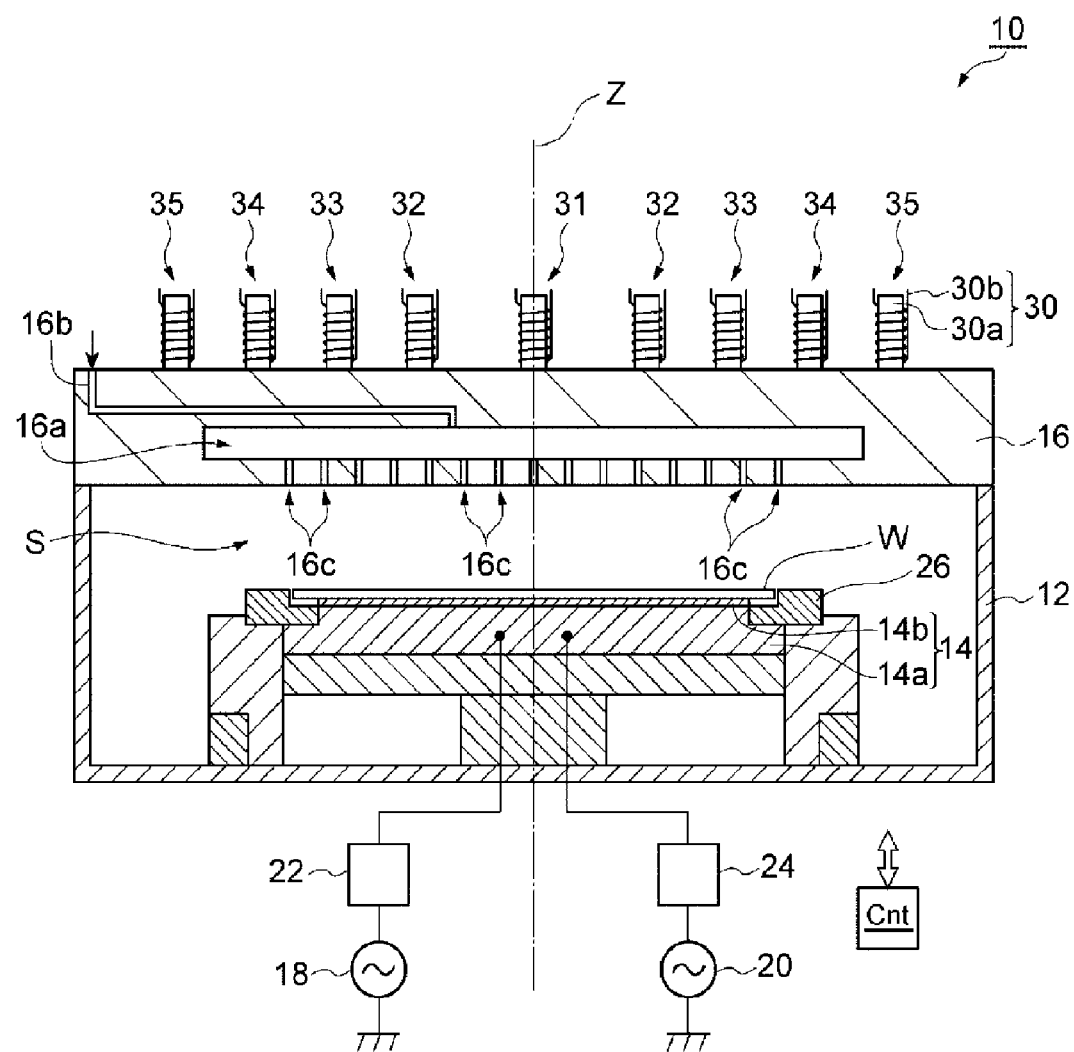
FIG. 1 is a schematic cross sectional view of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A plasma processing apparatus in which an etching method of a multilayer film in accordance with an example embodiment is performed will be explained first. FIG. 1 is a schematic cross sectional view of a plasma processing apparatus in accordance with the example embodiment. A plasma processing apparatus 10 depicted in FIG. 1 includes a processing chamber 12, a mounting table 14, an upper electrode 16, a first high frequency power supply 18, and a second high frequency power supply 20.

The processing chamber 12 has a substantially cylindrical shape and forms a processing space S therein. The processing space S is depressurizable by an exhaust device. In the processing space S, the mounting table 14 is provided. The mounting table 14 includes a base member 14a and an electrostatic chuck 14b. The base member 14a is made of a conductive material, for example, aluminum and has a substantially disc shape.

On an upper peripheral region of the base member 14a, a focus ring 26 is provided to surround an edge of a wafer W. Further, on an upper central region of the base member 14a, the electrostatic chuck 14b is provided. The electrostatic chuck 14b includes, for example, an electrode film interposed between insulating films and has a substantially disc shape. At the electrostatic chuck 14b, an electrostatic force is generated by a DC voltage applied to the electrode film from a DC power supply via a switch, and, thus, a target object W (hereinafter, referred to as "wafer W") is attracted and held. When the wafer W is mounted on the electrostatic chuck 14b, a central axis line Z vertically passing through a center of the wafer W substantially coincides with central axis lines of the base member 14a and the electrostatic chuck 14b. Further, the wafer W may have a diameter of, for example, about 300 mm.

The base member 14a serves as a lower electrode. The base member 14a is connected via a first matching unit 22 to the high frequency power supply 18 configured to generate a high frequency power for plasma generation. The high frequency power supply 18 generates a high frequency power having a frequency of, for example, about 100 MHz. Further, the first matching unit 22 includes a circuit capable of matching output impedance of the first matching unit 22 with input impedance of a load side (lower electrode side). Furthermore, the high frequency power supply 18 may be connected to the upper electrode 16. The base member 14a is connected via a second matching unit 24 to the high frequency power supply 20 configured to generate a high frequency power for ion attraction. The high frequency power supply 20 generates a high frequency power having a frequency of, for example, about 3.2 MHz. Further, the second matching unit 24 includes a circuit capable of matching output impedance of the second matching unit 24 with input impedance of a load side (lower electrode side).

Above the base member 14a, i.e. the lower electrode, the upper electrode 16 is provided to face the lower electrode via the processing space S. The upper electrode 16 partitions an upper portion of the processing space S and has a substantially disc shape. The upper electrode 16 is provided such that a central axis line thereof substantially coincides with the central axis line of the mounting table 14. The upper electrode 16 serves as a shower head. In accordance with the example embodiment, a buffer room 16a, a gas line 16b, and multiple gas holes 16c are formed in the upper electrode 16. The buffer room 16a is connected to an end of the gas line 16b. Further, the buffer room 16a is connected to the multiple gas holes 16c, and the gas holes 16c are extended downwardly and opened toward the processing space S.

Figure 2:
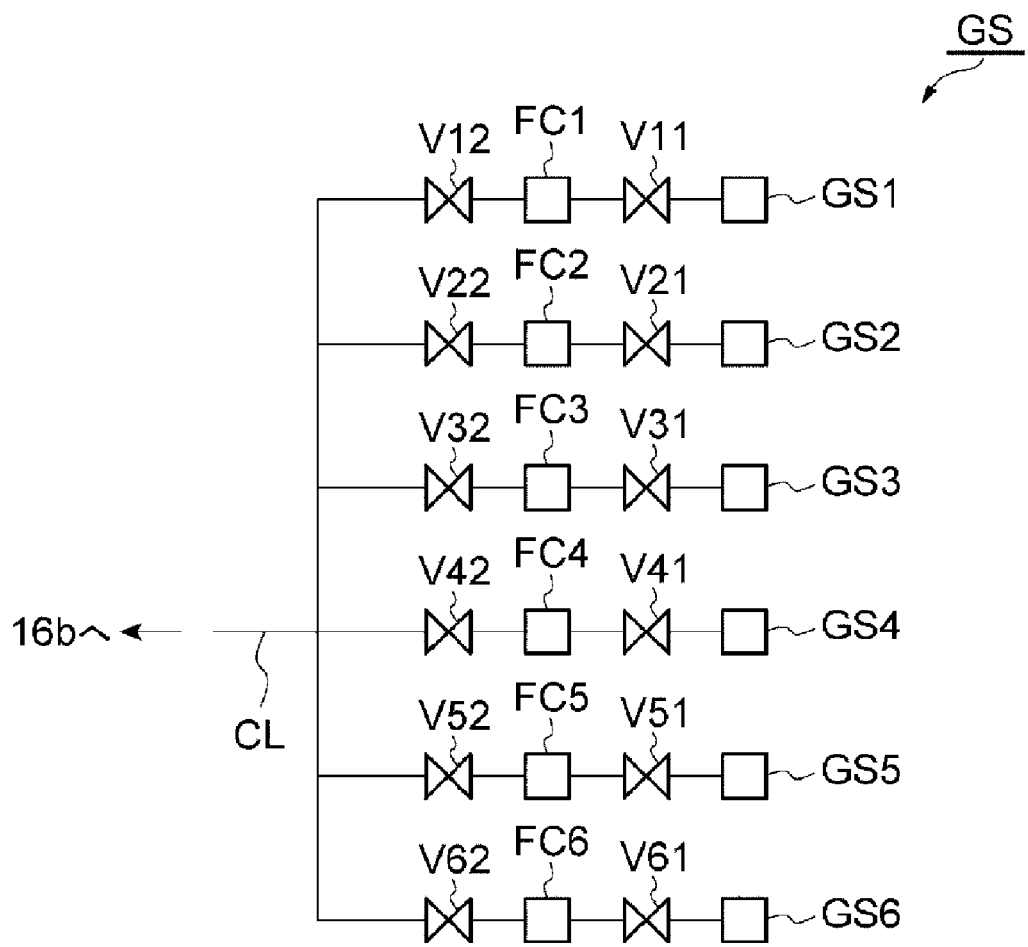
FIG. 2 illustrates a gas supply system of the plasma processing apparatus in accordance with the example embodiment.

FIG. 2 illustrates a gas supply system of the plasma processing apparatus in accordance with the example embodiment. The plasma processing apparatus 10 may further include a gas supply system GS depicted in FIG. 2. The gas supply system GS includes multiple gas sources GS1, GS2, GS3, GS4, GS5, and GS6. The gas source GS1 is a source of a $CHF_3$ gas, the gas source GS2 is a source of an $O_2$ gas, the gas source GS3 is a source of a $CH_4$ gas, the gas source GS4 is a source of a $N_2$ gas, the gas source GS5 is a source of a $C_4F_8$ gas, and the gas source GS6 is a source of an Ar gas.

In the gas supply system GS, the gas source GS1 is connected to a gas line CL via a valve V11, a flow rate controller FC1, and a valve V12; the gas source GS2 is connected to the gas line CL via a valve V21, a flow rate controller FC2, and a valve V22; the gas source GS3 is connected to the gas line CL via a valve V31, a flow rate controller FC3, and a valve V32; the gas source GS4 is connected to the gas line CL via a valve V41, a flow rate controller FC4, and a valve V42; the gas source GS5 is connected to the gas line CL via a valve V51, a flow rate controller FC5, and a valve V52; and the gas source GS6 is connected to the gas line CL via a valve V61, a flow rate controller FC6, and a valve V62. The gas line CL is connected to the other end of the gas line 16b depicted in FIG. 1.

In the plasma processing apparatus 10, a processing gas from the gas supply system GS is supplied to the processing space S through the upper electrode 16 serving as the shower head, and a high frequency power from the high frequency power supply 18 is applied to the lower electrode to generate a high frequency electric field between the upper electrode 16 and the lower electrode. Thus, plasma of the processing gas is generated in the processing space S. Further, the wafer W can be processed with active species of molecules or atoms, which constitute the dissociated processing gas, in the plasma. Furthermore, an amount of attracted ions can be controlled by adjusting a high frequency bias power applied to the lower electrode from the high frequency power supply 20.

Further, the plasma processing apparatus 10 further includes multiple electromagnets 30. The multiple electromagnets 30 are provided on the upper electrode 16, i.e. on a ceiling portion of the processing chamber 12. Each of the multiple electromagnets 30 includes a yoke 30a formed of a rod-shaped magnetic material and a coil 30b. The coil 30b is wound around an outer peripheral surface of the yoke 30a.

Since both ends of the coil 30b are connected to a current source, a value and a direction of a current supplied into the coil 30b can be controlled.

Figure 3:
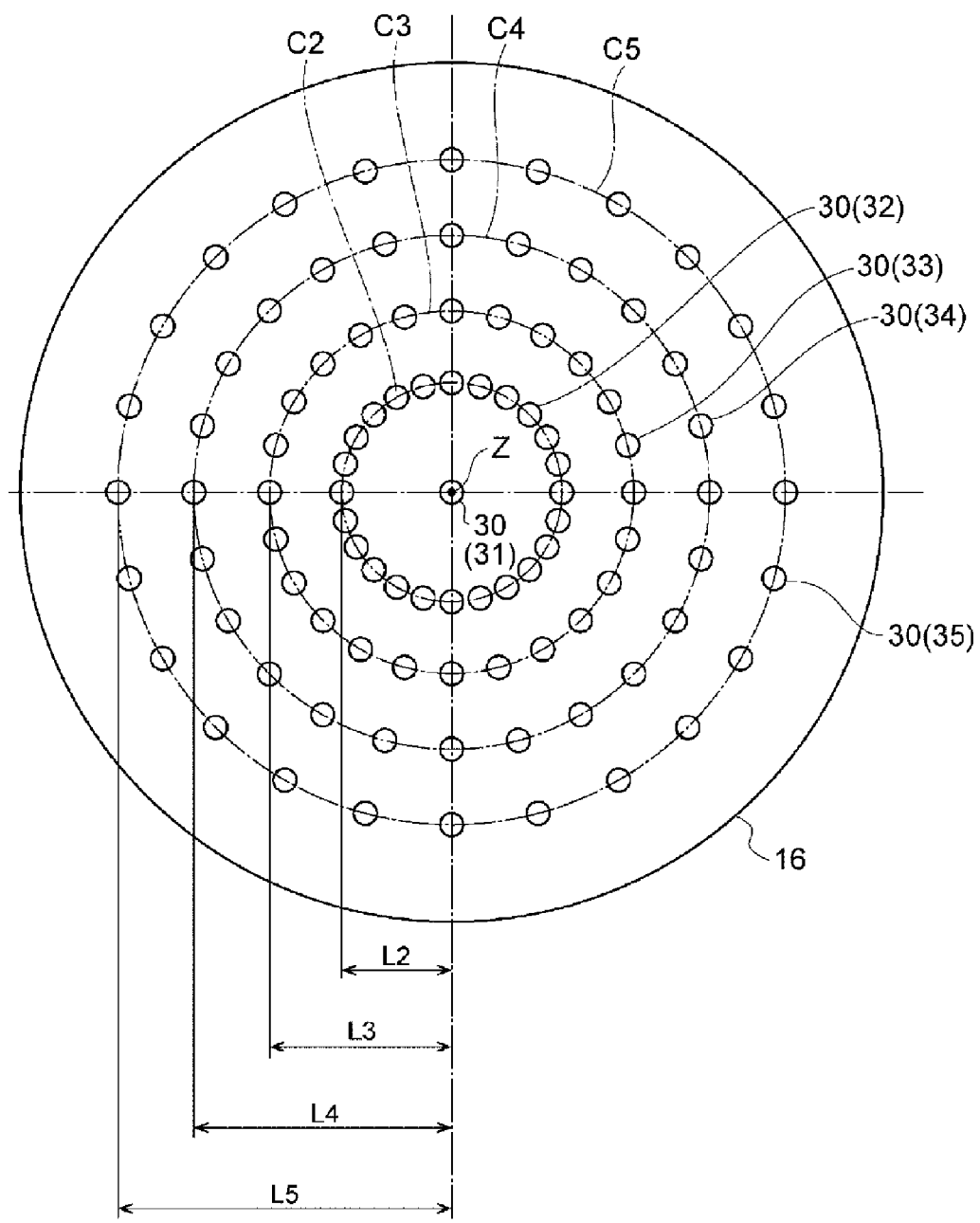
FIG. 3 is a plane view of the plasma processing apparatus of FIG. 1 when viewed from the top.

FIG. 3 is a plane view of the plasma processing apparatus of FIG. 1 when viewed from the top. As depicted in FIG. 3, the multiple electromagnets 30 are arranged in a radial direction with respect to the central axis line Z that passes through the center of the wafer W and is vertically extended. Further, the multiple electromagnets 30 are arranged along multiple concentric circles around the central axis line Z.

In accordance with the example embodiment, as depicted in FIG. 3, the multiple electromagnets 30 are divided into a first group 31, a second group 32, a third group 33, a fourth group 34, and a fifth group 35, and each group includes several electromagnets 30. The first group 31 may include one or more electromagnets 30 provided on or near the central axis line Z. In an example depicted in FIG. 3, the first group 31 includes one electromagnet 30, and the yoke 30a of the electromagnet 30 is provided along the central axis line Z.

Further, in the example depicted in FIG. 3, each of the second group 32, the third group 33, the fourth group 34, and the fifth group 35 includes 24 electromagnets 30. In FIG. 3, each number in parentheses next to the reference numeral 30 is a reference numeral of each group. The electromagnets 30 of the second group 32 are arranged on a circle C2 having a radius L2 such that the yokes 30a are extended substantially parallel to the central axis line Z. The radius L2 is about 75 mm in the plasma processing apparatus that processes the wafer W having a diameter of about 300 mm. The electromagnets 30 of the third group 33 are arranged on a circle C3 having a radius L3 such that the yokes 30a are extended substantially parallel to the central axis line Z. The radius L3 is greater than the radius L2, and the radius L3 is about 125 mm in the plasma processing apparatus that processes the wafer W having a diameter of about 300 mm. The electromagnets 30 of the fourth group 34 are arranged on a circle C4 having a radius L4 such that the yokes 30a are extended substantially parallel to the central axis line Z. The radius L4 is greater than the radius L3, and the radius L4 is about 175 mm in the plasma processing apparatus that processes the wafer W having a diameter of about 300 mm. Further, the electromagnets 30 of the fifth group 35 are arranged on a circle C5 having a radius L5 such that the yokes 30a are extended substantially parallel to the central axis line Z. The radius L5 is greater than the radius L4, and the radius L5 is about 225 mm in the plasma processing apparatus that processes the wafer W having a diameter of about 300 mm.

Further, as depicted in FIG. 1, the plasma processing apparatus 10 may further include a control unit Cnt. The control unit Cnt may be a computer device. The control unit Cnt is configured to set a magnitude of a high frequency power generated from the first high frequency power supply 18, a magnitude of a high frequency power generated from the second high frequency power supply 20, an exhaust amount of the exhaust device, gases supplied from the gas supply system GS and flow rates thereof, and a value and a direction of a current supplied into the coil 30b of each electromagnet 30 of the first group 31, the second group 32, the third group 33, the fourth group 34, and the fifth group 35. For this reason, the control unit Cnt may output a control signal to the first high frequency power supply 18, the second high frequency power supply 20, the exhaust device, each component of the gas supply system GS, and the current source connected to the electromagnets 30 in response to a recipe stored in a memory thereof or input through an input device.

In the plasma processing apparatus 10, by setting a direction of a current to be supplied into the coil 30b of each electromagnet 30 of the first group 31, the second group 32, the third group 33, the fourth group 34, and the fifth group 35, it is possible to set a magnetic pole of each electromagnet 30 of the first group 31, the second group 32, the third group 33, the fourth group 34, and the fifth group 35 at the processing space S side to be an N pole or an S pole. Thus, it is possible to generate a magnetic field having horizontal magnetic field components in a radial direction with respect to the central axis line Z in the processing space S.

Figure 4A:
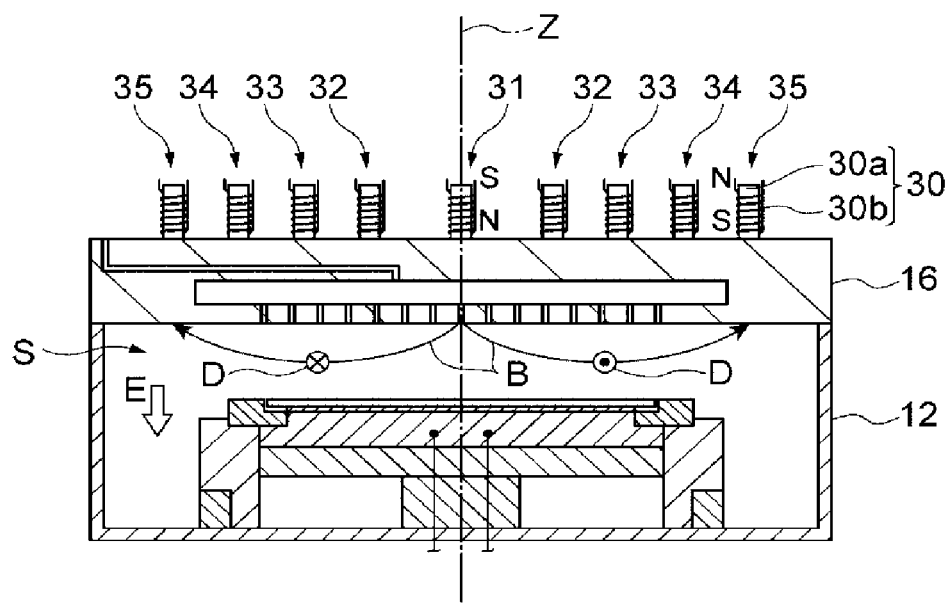
FIGS. 4A and 4B are drawings to explain a drift motion of an electron caused by an electric field and a magnetic field generated in the plasma processing apparatus of FIG. 1.
Figure 4B:
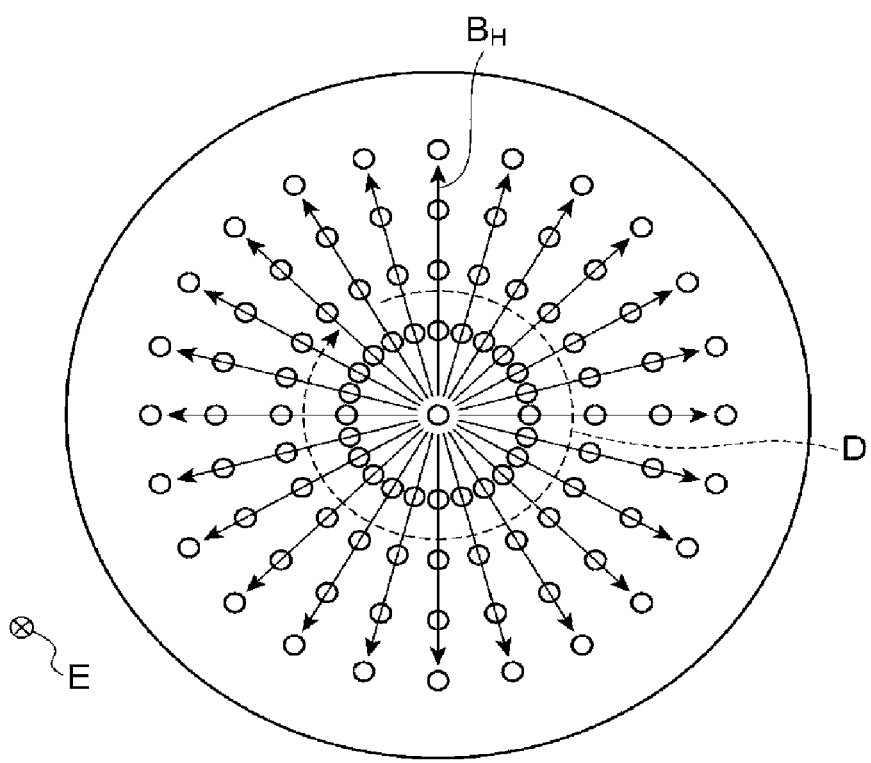

FIGS. 4A and 4B are drawings to explain a drift motion of an electron caused by an electric field and a magnetic field generated in the plasma processing apparatus of FIG. 1. FIG. 4A is a cross sectional view of the plasma processing apparatus 10, and FIG. 4B is a plane view of the plasma processing apparatus 10 when viewed from the top. As depicted in FIGS. 4A and 4B, there is generated an electric field E toward the lower electrode (base member 14a) from the upper electrode 16 within the processing space S while plasma is generated. Further, as depicted in FIGS. 4A and 4B, for example, if a magnetic pole of the electromagnet 30 of the first group 31 at the processing space S side is set to be an N pole by adjusting a direction of a current supplied into the coil 30b of the electromagnet 30 of the first group 31 and each magnetic pole of the electromagnets 30 of the fifth group 35 at the processing space S side is set to be an S pole by adjusting a direction of a current supplied into the coils 30b of the electromagnets 30 of the fifth group 35, there is generated a magnetic field B toward the magnetic pole of the electromagnets 30 of the fifth group 35 at the processing space S side from the magnetic pole of the electromagnet 30 of the first group 31 at the processing space S side. As depicted in FIG. 4B, the magnetic field B includes horizontal magnetic field components $B_H$ in a radial direction with respect to the axis line Z.

As described above, the electric field E and the magnetic field B having the horizontal magnetic field components $B_H$ are generated within the processing space S, and electrons within the processing space S are subject to Lorentz force caused by the electric field and the horizontal magnetic field components $B_H$, and perform the drift motion. To be specific, the electrons are accelerated in a tangent direction of a circumference around the central axis line Z and revolved on the central axis line Z along a circular electron trajectory D according to the Fleming's left-hand rule.

However, a velocity $V_{gE}$ of the electron performing the drift motion caused by the electric field E and the horizontal magnetic field components $B_H$ is expressed by the following Equation (1).

$$v_{gE} = E/B_H \quad (1)$$

According to Equation (1), when the intensity of the electric field E is constant, the velocity of the electron performing the drift motion is decreased as the intensity of the horizontal magnetic field components $B_H$ (magnetic field intensity) is increased. When the velocity of the electron performing the drift motion is decreased, a staying time in which electrons stay at a specific location is increased and, thus, an electron density at the corresponding location is increased. As a result, a possibility of collision between the electrons and molecules or atoms of the processing gas is increased, so that a plasma density at the corresponding location is increased. That is, by increasing the intensity of the horizontal magnetic field components $B_H$ at a certain location by the electromagnets 30, the plasma density at the corresponding location can be increased.

As described above, the plasma processing apparatus 10 can set a direction and a value of a current supplied into the coils 30b of the multiple electromagnets 30 for each of the first group 31, the second group 32, the third group 33, the fourth group 34, and the fifth group 35. Therefore, in the plasma processing apparatus 10, by adjusting a direction of a current supplied into the coils 30b of the electromagnets 30 of each of the first group 31, the second group 32, the third group 33, the fourth group 34, and the fifth group 35, an intensity distribution of the horizontal magnetic field components $B_H$ in a radial direction with respect to the axis line Z can be adjusted. Further, by adjusting a magnitude (value) of the current supplied into the coils 30b of the electromagnets 30 of each of the first group 31, the second group 32, the third group 33, the fourth group 34, and the fifth group 35, intensity of the horizontal magnetic field components $B_H$ in a radial direction with respect to the axis line Z can be adjusted.

Figure 5:
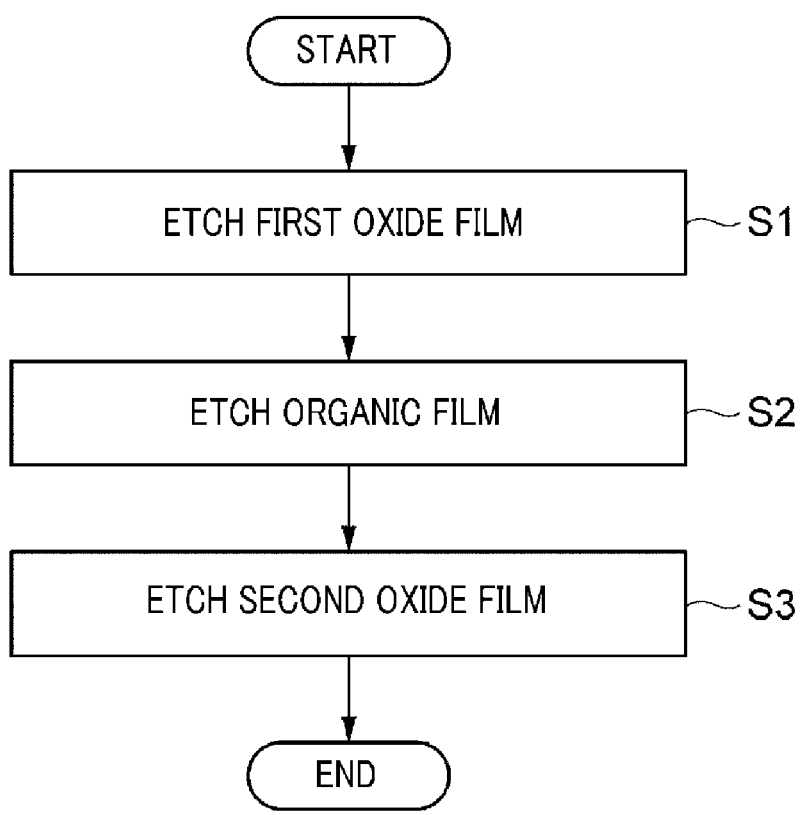
FIG. 5 is a flow chart illustrating an etching method of a multilayer film in accordance with the example embodiment.

Hereinafter, there will be explained an etching method of a multilayer film in accordance with the example embodiment, which can be performed in the plasma processing apparatus 10. FIG. 5 is a flow chart illustrating the etching method of the multilayer film in accordance with the example embodiment. The method illustrated in FIG. 5 can be performed to etch a multilayer film ML of a wafer W depicted in FIG. 6. Further, FIG. 6 is a cross sectional view of an enlarged part of the wafer W.

Figure 6:
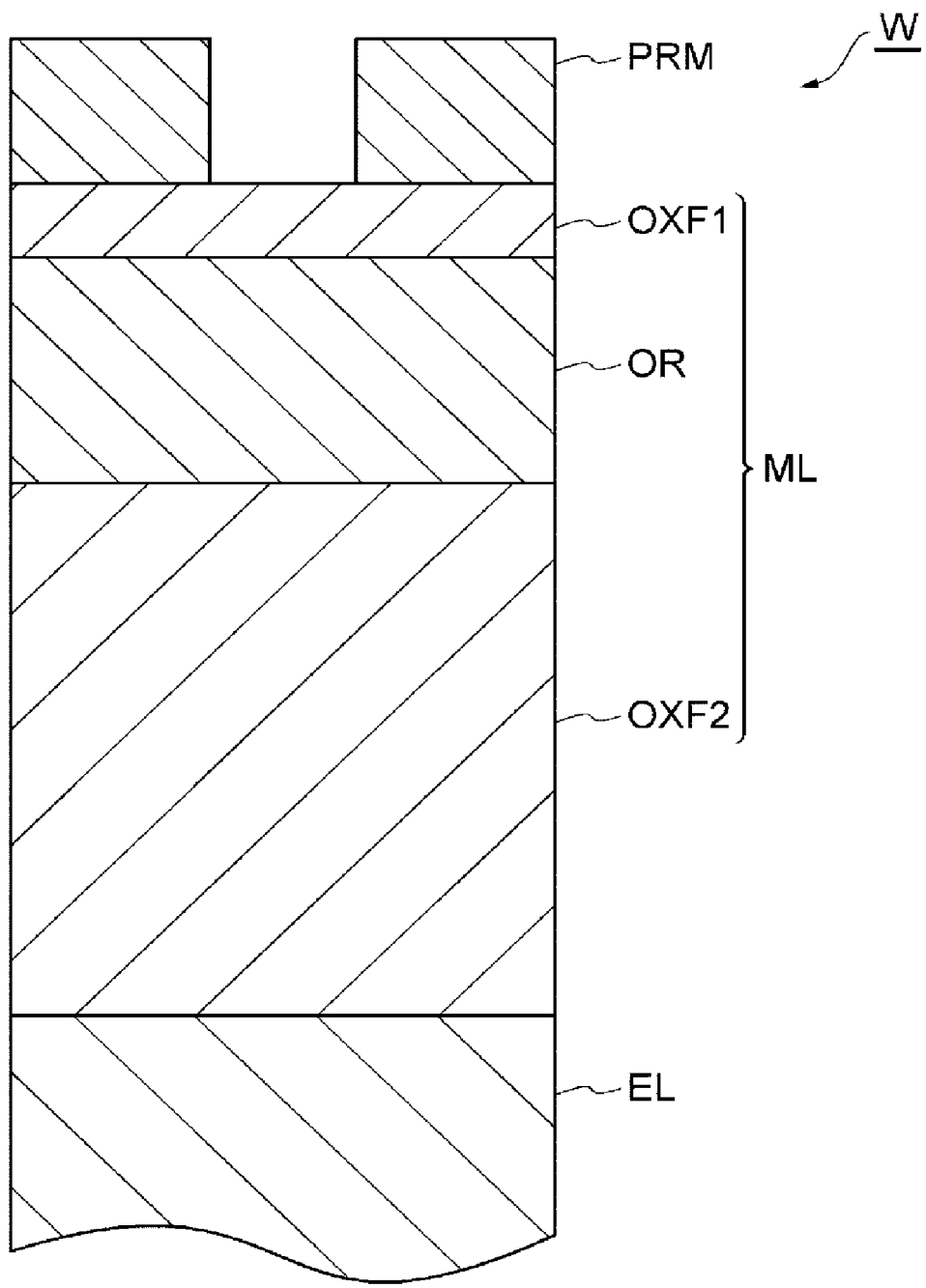
FIG. 6 is a cross sectional view of an example of a wafer including a multilayer film.

The wafer W depicted in FIG. 6 includes a resist mask PRM, a first oxide film OXF1, an organic film OR, a second oxide film OXF2, and an etching target layer EL. The etching target layer EL is a layer to be etched by using a mask formed by etching the second oxide film OXF2, and is, for example, a silicon layer. On the etching target layer EL, the second oxide film OXF2 is formed. The second oxide film OXF2 is a silicon oxide layer and has a relatively great film thickness which can endure the etching of the etching target layer EL having a great film thickness. The thickness of the second oxide film OXF2 is, for example, about 2000 nm.

On the second oxide film OXF2, the organic film OR is formed. The organic film OR serves as a mask to be used in etching the second oxide film OXF2. A thickness of the organic film OR is, for example, about 300 nm.

On the organic film OR, the first oxide film OXF1 is formed. The first oxide film OXF1 serves as a mask to be used in etching the organic film OR. The first oxide film OXF1 is, for example, a silicon oxide layer. The first oxide film OXF1 has a thickness smaller than that of the second oxide film OXF2. A thickness of the first oxide film OXF1 is, for example, 45 nm.

On the first oxide film OXF1, the resist mask PRM is formed. The resist mask PRM can be formed by coating a resist material on the first oxide film OXF1, and then, exposing/developing the resist material.

Figure 7:
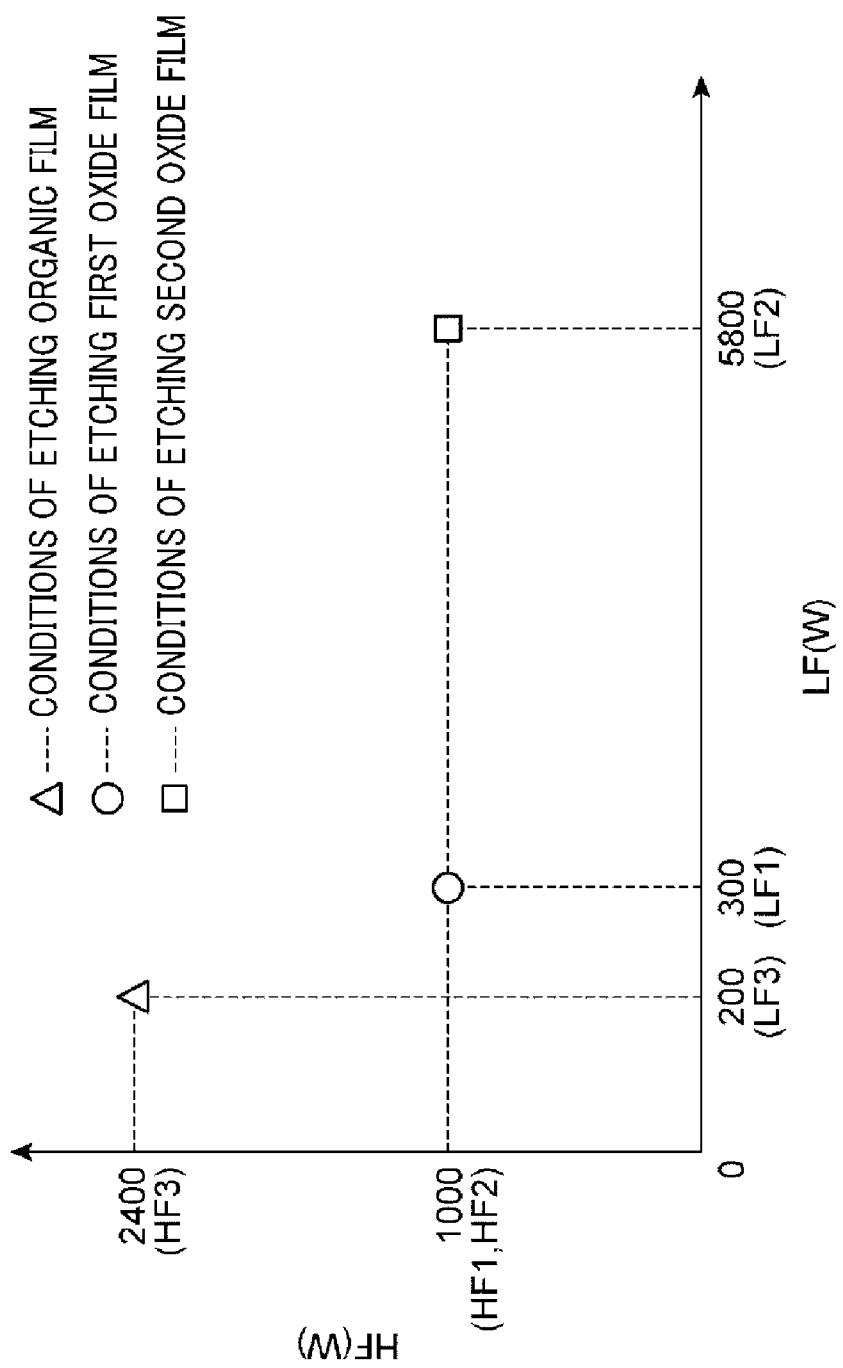
FIG. 7 illustrates high frequency powers and high frequency bias powers when etching each film of the multilayer film is etched.

As described above, the wafer W includes the multilayer film ML having a stacked structure of multiple films different from each other in a kind of a film and/or a thickness of a film. As plasma generation conditions during the etching of each film of the multilayer film ML, various conditions are employed depending on a kind of a film and/or a thickness of a film. FIG. 7 illustrates high frequency powers and high frequency bias powers when etching each film of the multilayer film. In FIG. 7, a horizontal axis represents a high frequency bias power LF for ion attraction, and a longitudinal axis represents a high frequency power HF for plasma generation.

In the wafer W, the second oxide film OXF2 is formed as an underlying film of the organic film OR. The second oxide film OXF2 serves as a mask for etching the etching target layer EL. Therefore, when the organic film OR is etched, it is necessary to reduce damage to the second oxide film OXF2. Therefore, the organic film OR is etched with a large amount of active species, such as radicals, generated by dissociation of molecules and/or atoms in the processing gas with a relatively higher high frequency power HF (for example, about 2400 W). Further, the organic film OR is etched with low energy by using a relatively lower high frequency bias power LF (for example, about 200 W). Thus, it is possible to reduce damage to the second oxide film OXF2. Hereinafter, a value of the high frequency power and a value of the high frequency bias power during the etching of the organic film OR will be referred to as HF3 and LF3, respectively.

Meanwhile, the first oxide film OXF1 and the second oxide film OXF2 are etched by attracting a large amount of active species, such as ions, generated by dissociation of molecules and/or atoms in the processing gas toward the wafer W. For this reason, when the first oxide film OXF1 and the second oxide film OXF2 are etched, the high frequency power HF for plasma generation is set to be a lower value (for example, about 1000 W) and the high frequency bias power LF for ion attraction is set to be a higher value. Herein, a value of the high frequency power HF during the etching of the first oxide film OXF1 will be referred to as HF1, a value of the high frequency power HF during the etching of the second oxide film OXF2 will be referred to as HF2. Further, a value of the high frequency bias power LF during the etching of the first oxide film OXF1 will be referred to as LF1, and a value of the high frequency bias power LF during etching of the second oxide film OXF2 will be referred to as LF2. In this case, these values have conditions as follows: HF3>HF1, HF3>HF2, LF1>LF3, and LF2>LF3.

Further, in the example embodiment, a thickness of the second oxide film OXF2 is greater than that of the first oxide film OXF1. Therefore, when the second oxide film OXF2 is etched, it is desirable to increase an etching rate of the second oxide film OXF2 by attracting ions having higher energy toward the wafer W. Therefore, in the example embodiment, LF2 and LF1 have a condition as follows: LF2>LF1.

Figure 8:
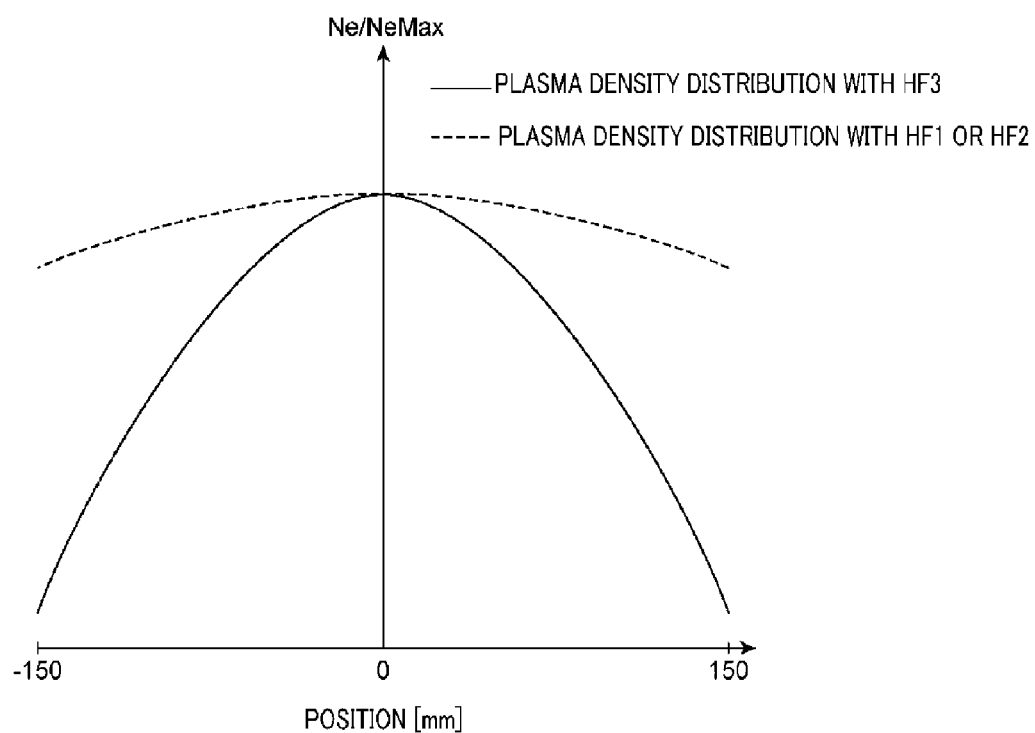
FIG. 8 illustrates a correlation between a high frequency power and a plasma density distribution.

In the above-described plasma processing apparatus 10, if plasma is generated with the set high frequency powers for etching each of the first oxide film OXF1, the second oxide film OXF2, and the organic film OR without generating a magnetic field by the electromagnets 30, a plasma density distribution within the processing space S becomes non-uniform in a radial direction with respect to the axis line Z. FIG. 8 illustrates a correlation between a high frequency power and a plasma density distribution. In FIG. 8, a horizontal axis represents a position in a radial direction from the central axis line Z, and a position of the central axis line Z is set to be about 0 mm. Further, in FIG. 8, a longitudinal axis represents a normalized value of an electron density (Ne) by a maximum value (NeMax) of the electron density, and indicates a value reflecting a plasma density. Furthermore, in FIG. 8, a plasma density distribution shown in a dotted line shows a density distribution of plasma generated by the high frequency power having the value HF1 for etching the first oxide film OXF1 and the high frequency power having the value HF2 for etching the second oxide film OXF2. Meanwhile, a plasma density distribution shown in a solid line shows a density distribution of plasma generated by the high frequency power having the value HF3 for etching the organic film OR.

As depicted in FIG. 8, even if any one of the high frequency powers for etching the first oxide film OXF1, the second oxide film OXF2, and the organic film OR is used, a plasma density distribution has a gradient in which a plasma density is high near the central axis line Z and becomes decreased as farther from the central axis line Z. Further, when using the high frequency power having the value HF3 for etching the organic film OR, this gradient tends to be remarkable. That is, when plasma for etching the organic film OR is generated, the high frequency power having the high value HF3 is used. Therefore, a plasma density distribution obtained when etching the organic film OR has a gradient in which a plasma density difference between when using the high frequency power of HF3 and when using the high frequency power of HF1 or when using the high frequency power of HF2 is larger at a position closer to the central axis line Z.

Figure 9A:
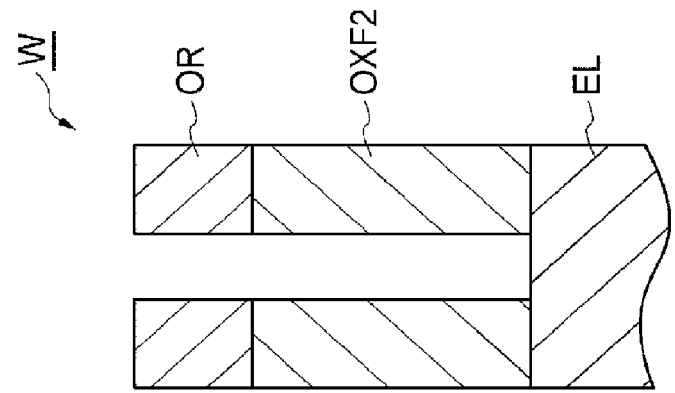
FIGS. 9A to 9C are cross sectional views illustrating statuses of a wafer after each block of the method illustrated in FIG. 5.
Figure 9B:
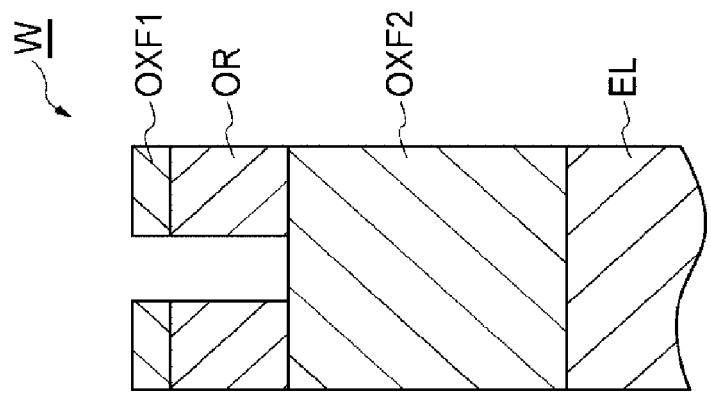
Figure 9C:
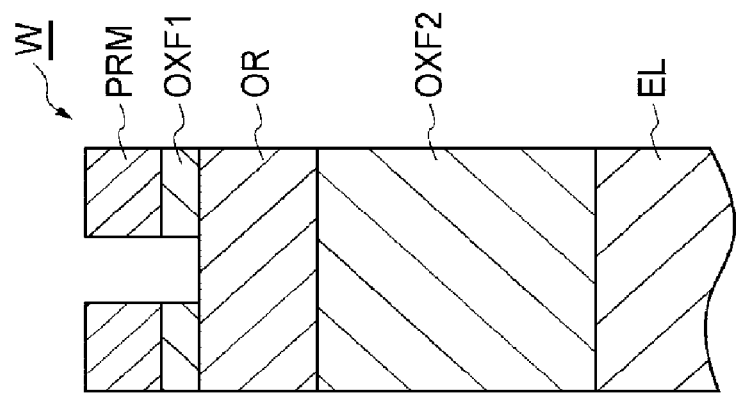

According to the method illustrated in FIG. 5, non-uniformity of the plasma density distribution can be reduced by using electromagnets. Hereinafter, referring to FIG. 5 and FIGS. 9A to 9C, the method will be described. FIGS. 9A to 9C are cross sectional views illustrating a status of a wafer W after performing each block of the method illustrated in FIG. 5. According to the method illustrated in FIG. 5, before block S1 (Etch First Oxide Film), the wafer W depicted in FIG. 6 is accommodated into the processing space S and mounted on the electrostatic chuck 14b of the mounting table 14. Then, at block S1, the first oxide film OXF1 is etched. At block S1, as a first processing gas, a processing gas including a fluorocarbon gas and/or a fluorohydrocarbon gas is supplied into the processing space S. By way of example, at block S1, a processing gas including a $CHF_3$ gas of the gas source GS1 and an $O_2$ gas of the gas source GS2 is supplied into the processing space S. Further, at block S1, the high frequency power having the value HF1 and the high frequency bias power having the value LF1 are applied to the lower electrode. The high frequency power may be applied to the upper electrode 16.

As described above, if a magnetic field is not generated by the electromagnets, a density of plasma generated by applying the high frequency power having the value HF1 to the electrode has a distribution as shown in the dotted line in FIG. 8. Therefore, in the example embodiment, at block S1, the magnetic field B is formed such that a position of a peak intensity of the horizontal magnetic field components $B_H$ is farther from the central axis line Z than a position of a peak intensity of the horizontal magnetic field components $B_H$ at block S2 to be described later.

Figure 10A:
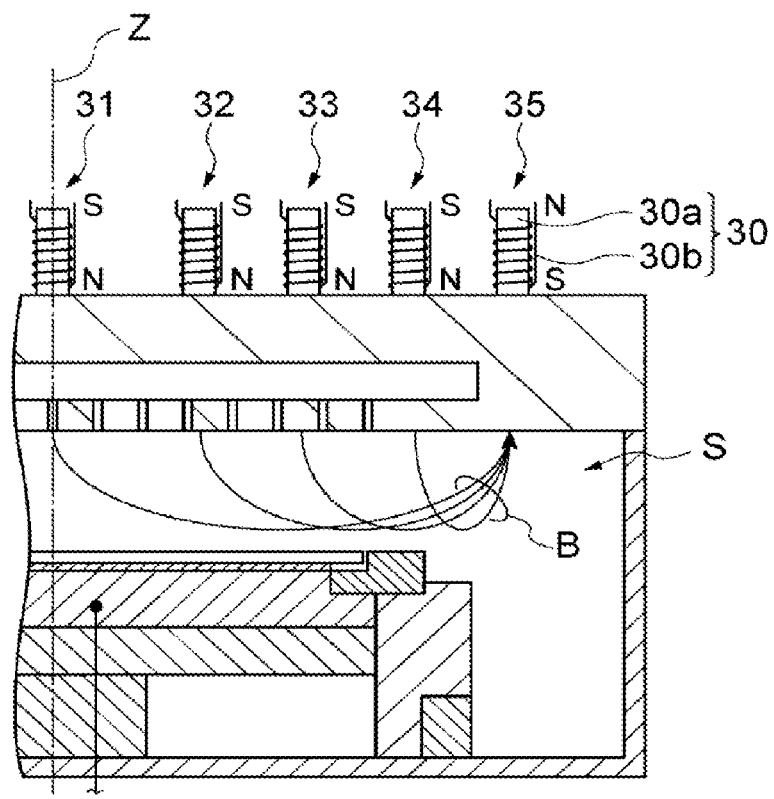
Figure 10B:
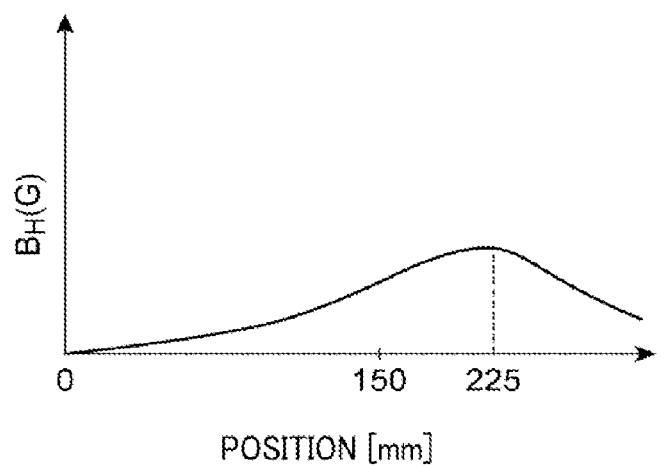

FIGS. 10A and 1013 illustrate magnetic fields generated at block S1 and block S3. FIG. 10A is a cross sectional view of the plasma processing apparatus 10, and FIGS. 10A and 1013 show an intensity distribution of the horizontal magnetic field components $B_H$ (magnetic flux density distribution). As depicted in FIG. 10A, in accordance with the example embodiment, at block S1, a magnetic pole of the electromagnets 30 of the first group 31 to the fourth group 34 at the processing space S side is set to be an N pole, and a magnetic pole of the electromagnets 30 of the fifth group 35 at the processing space S side is set to be an S pole. Thus, in the processing space S, a magnetic field B depicted in FIG. 10A is generated. When the wafer W having a diameter of about 300 mm is processed, as depicted in FIG. 10B, the horizontal magnetic field components $B_H$ in this magnetic field B have the peak intensity at an outer position (for example, about 225 mm away from the central axis line Z) of an edge of the wafer W in a radial direction. Since the magnetic field B having the horizontal magnetic field components $B_H$ is generated, a plasma density is increased in an upper outer region of the edge of the wafer W. As a result, non-uniformity of a plasma density distribution having a relatively gentle gradient is reduced. Therefore, at block S1, non-uniformity of the plasma density distribution in a radial direction with respect to the central axis line Z is reduced.

At block S1, as depicted in FIG. 9A, the first oxide film OXF1 is etched and a pattern of the resist mask PRM is transcribed into the first oxide film OXF1. Further, since non-uniformity of the plasma density distribution in a radial direction with respect to the central axis line Z is reduced, non-uniformity of the etching rate depending on a position in a diametric direction of the first oxide film OXF1 is reduced. Here, the diametric direction implies a direction parallel to the radial direction. Processing may proceed from block S1 to block S2.

Hereinafter, according to the method illustrated in FIG. 5, at block S2 (Etch Organic Film), the organic film OR is etched. At block S2, as a second processing gas, a processing gas including oxygen is supplied into the processing space S. By way of example, at block S2, the processing gas including an $O_2$ gas of the gas source GS2, a $CH_4$ gas of the gas source GS3, and a $N_2$ gas of the gas source GS4 is supplied into the processing space S. Further, at block S2, the high frequency power having the value HF3 and the high frequency bias power having the value LF3 are applied to the lower electrode. The high frequency power may be applied to the upper electrode 16.

As described above, if a magnetic field is not generated by the electromagnets 30, a density of plasma generated by applying the high frequency power having the value HF3 to the electrode has a distribution as shown in the solid line in FIG. 8. Therefore, in the example embodiment, at block S2, the magnetic field B is formed such that a position of the peak intensity of the horizontal magnetic field components $B_H$ is closer to the central axis line Z than a position of the peak intensity of the horizontal magnetic field components $B_H$ at block 51 and block S3.

Figure 11A:
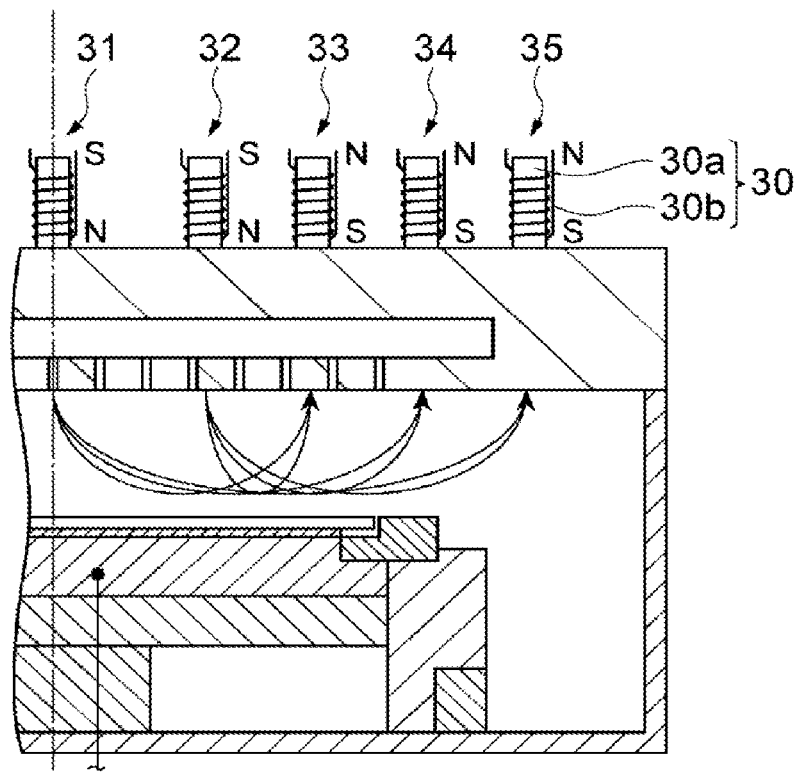
FIGS. 11A and 11B illustrate a magnetic field generated at block S2.
Figure 11B:
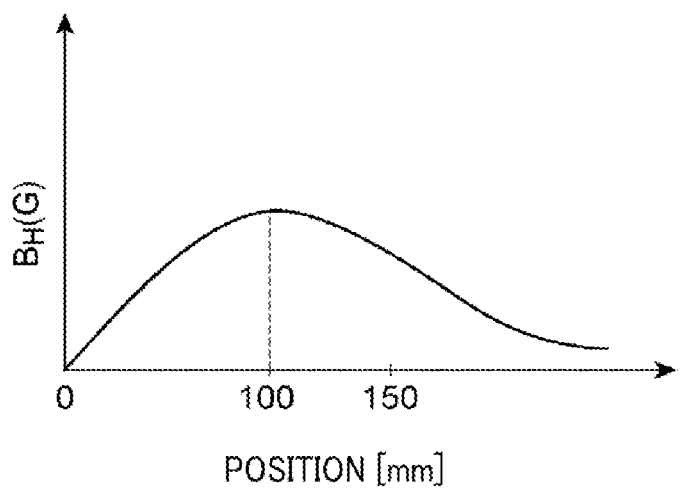

FIGS. 11A and 11B illustrate a magnetic field generated at block S2. FIG. 11A is a cross sectional view of the plasma processing apparatus 10, and FIG. 11B shows an intensity distribution of the horizontal magnetic field components $B_H$ (magnetic flux density distribution). As depicted in FIG. 11A, in accordance with the example embodiment, at block S2, a magnetic pole of the electromagnets 30 of the first group 31 and the second group 32 at the processing space S side is set to be an N pole, and a magnetic pole of the electromagnets 30 of the third group 33 to the fifth group 35 at the processing space S side is set to be an S pole. Thus, in the processing space S, a magnetic field B depicted in FIG. 11A is generated. When the wafer W having a diameter of about 300 mm is processed, as depicted in FIG. 11B, the horizontal magnetic field components $B_H$ in this magnetic field B have the peak intensity at an intermediate position (for example, about 100 mm away from the central axis line Z) between the edge and the center of the wafer W in a radial direction. Since the magnetic field B having the horizontal magnetic field components $B_H$ is generated, a plasma density is increased in an upper region of the intermediate position between the edge and the center of the wafer W. As a result, non-uniformity of a plasma density distribution having a steep gradient in which a plasma density is decreased at a position close to the central axis line Z is reduced. Therefore, at block S2, non-uniformity of the plasma density distribution in a radial direction with respect to the central axis line Z is reduced.

At block S2, as depicted in FIG. 9B, the organic film OR is etched and a pattern of the first oxide film OXF1 is transcribed into the organic film OR. Further, at block S2, since the oxygen-based gas is used, the resist mask PRM made of an organic material like the organic film OR is removed. Furthermore, as described above, since non-uniformity of the plasma density distribution in a radial direction with respect to the central axis line Z is reduced, non-uniformity of the etching rate depending on a position in a diametric direction of the organic film OR is reduced at block S2. Processing may proceed from block S2 to block S3.

Hereinafter, in the method illustrated in FIG. 5, at block S3 (Etch Second Oxide Film), the second oxide film OXF2 is etched. At block S3, as a third processing gas, a processing gas including a fluorocarbon gas and/or a fluorohydrocarbon gas is supplied into the processing space S. By way of example, at block S3, the processing gas including a $C_4F_8$ gas of the gas source GS5, an $O_2$ gas of the gas source GS2, and an Ar gas of the gas source GS6 is supplied into the processing space S. Further, at block S3, the high frequency power having the value HF2 and the high frequency bias power having the value LF2 are applied to the lower electrode. The high frequency power may be applied to the upper electrode 16.

As described above, if a magnetic field is not generated by the electromagnets 30, a density of plasma generated by applying the high frequency power having the value HF2 to the electrode has a distribution as shown in the dotted line in FIG. 8. That is, a density distribution of plasma generated with the high frequency power having the value HF2 and the high frequency bias power having the value LF2 for block S3 has a gradient similar to that of a density distribution of plasma generated with the high frequency power having the value HF1 and the high frequency bias power having the value LF1 for block S1. Therefore, in the example embodiment, at block S3, the magnetic field B is formed such that a position of the peak intensity of the horizontal magnetic field components $B_H$ is farther from the central axis line Z than a position of the peak intensity of the horizontal magnetic field components $B_H$ at block S2. That is, at block S3, as depicted in FIGS. 10A and 10B, there is formed the magnetic field having the same intensity distribution of the horizontal magnetic field components $B_H$ as shown at block S1. However, the magnetic field formed at block S3 is formed such that an intensity value of the horizontal magnetic field components $B_H$ is higher than an intensity value of the horizontal magnetic field components $B_H$ at block S1. Further, an intensity value of the horizontal magnetic field components $B_H$ can be controlled by adjusting values of currents supplied into the coils of the electromagnets 30 of the first to fifth groups 31 to 35. As described above, at block S3, non-uniformity of the plasma density distribution in a radial direction with respect to the central axis line Z is reduced.

At block S3, as depicted in FIG. 9C, the second oxide film OXF2 is etched and a pattern of the organic film OR is transcribed into the second oxide film OXF2. Further, the first oxide film OXF1 made of a material similar to that of the second oxide film is removed at block S3. Furthermore, since non-uniformity of the plasma density distribution in a radial direction with respect to the central axis line Z is reduced, non-uniformity of the etching rate depending on a position in a diametric direction of the second oxide film OXF2 is reduced.

Figure 12:
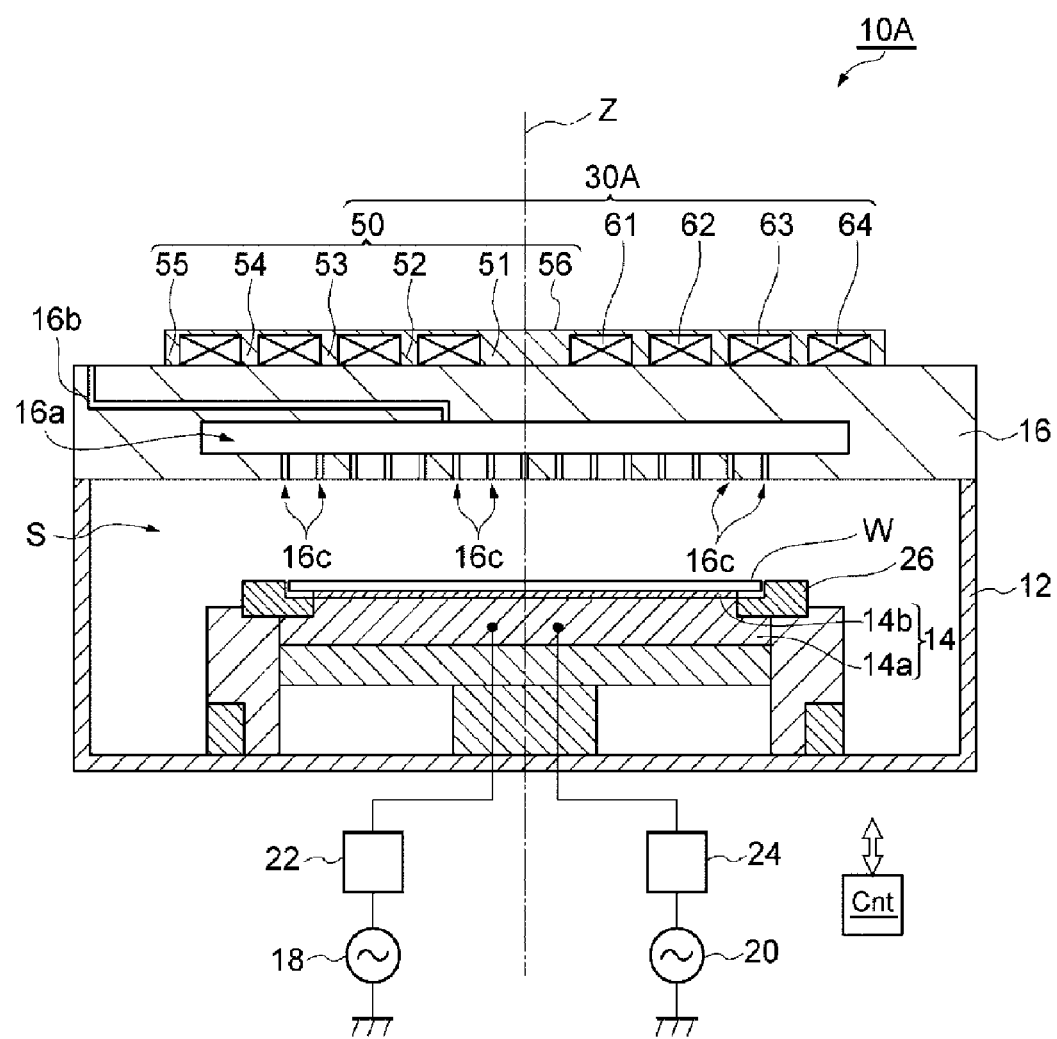
FIG. 12 is a schematic cross sectional view of a plasma processing apparatus in accordance with a second example embodiment.
Figure 13:
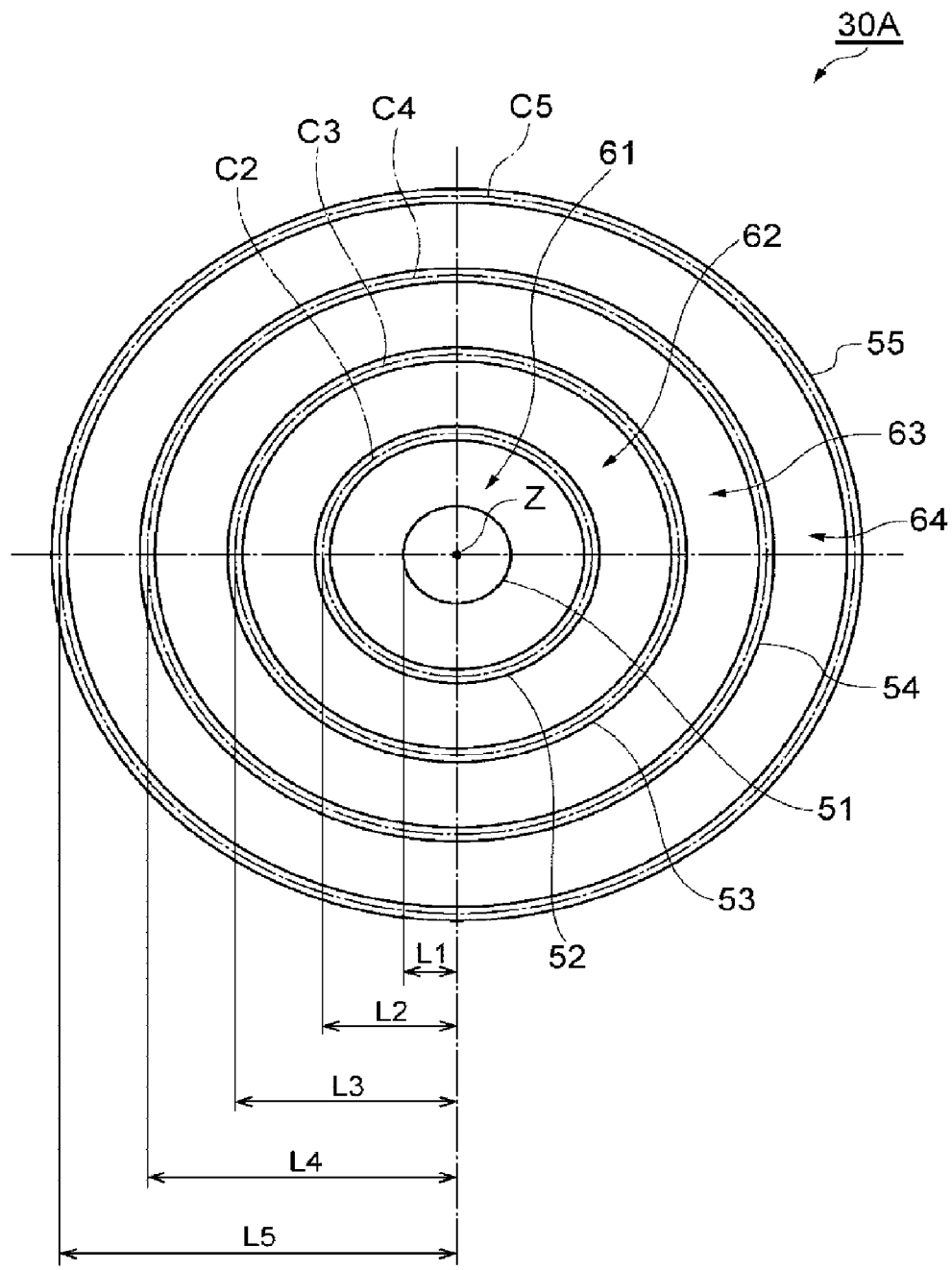
FIG. 13 is a plane view of an electromagnet when viewed from a processing space.

Hereinafter, another plasma processing apparatus in which the method illustrated in FIG. 5 is performed will be explained. FIG. 12 is a schematic cross sectional view of a plasma processing apparatus in accordance with a second example embodiment. The plasma processing apparatus 10A depicted in FIG. 12 is different from the plasma processing apparatus 10 in that the plasma processing apparatus 10A includes an electromagnet 30A instead of the electromagnets 30. Hereinafter, referring to FIG. 12 and FIG. 13, the electromagnet 30A will be explained. FIG. 13 is a plane view of the electromagnet 30A when viewed from the processing space S.

As depicted in FIG. 12 and FIG. 13, the electromagnet 30A includes a core member 50 and coils 61 to 64. The core member 50 has a structure including a column-shaped member 51, multiple cylindrical members 52 to 55, and a base member 56, which are integrally formed with each other, and is made of a magnetic material. The base member 56 has a substantially disc shape and is provided such that a central axis line thereof coincides with the central axis line Z. From a bottom surface of the base member 56, the column-shaped member 51 and the multiple cylindrical members 52 to 55 are extended downwardly. The column-shaped member 51 has a substantially column shape and is provided such that a central axis line thereof coincides with the central axis line Z. A radius L1 of the column-shaped member 51 is, for example, about 30 mm.

Each of the cylindrical members 52 to 55 has a cylindrical shape extended in a direction of the central axis line Z. The cylindrical members 52 to 55 are respectively arranged along multiple concentric circles C2 to C5 around the central axis line Z. To be specific, the cylindrical member 52 is extended along the concentric circle C2 having a radius L2 greater than the radius L1; the cylindrical member 53 is extended along the concentric circle C3 having a radius L3 greater than the radius L2; the cylindrical member 54 is extended along the concentric circle C4 having a radius L4 greater than the radius L3; and the cylindrical member 55 is extended along the concentric circle C5 having a radius L5 greater than the radius L4. In the example, the radiuses L2, L3, L4, and L5 are about 76 mm, about 127 mm, about 178 mm, and about 229 mm, respectively.

Between the column-shaped member 51 and the cylindrical member 52, a groove is formed. In this groove, a coil 61 wound around an outer peripheral surface of the column-shaped member 51 is accommodated. Between the cylindrical member 52 and the cylindrical member 53, a groove is formed, and in this groove, a coil 62 wound around an outer peripheral surface of the cylindrical member 52 is accommodated. Further, between the cylindrical member 53 and the cylindrical member 54, a groove is formed, and in this groove, a coil 63 wound around an outer peripheral surface of the cylindrical member 53 is accommodated. Furthermore, between the cylindrical member 54 and the cylindrical member 55, a groove is formed, and in this groove, a coil 64 wound around an outer peripheral surface of the cylindrical member 54 is accommodated. Both ends of each of the coils 61 to 64 are connected to current sources. Start or stop of the supply of a current to each of the coils 61 to 64, and a current value can be controlled in response to a control signal from the control unit Cnt.

Figure 14A:
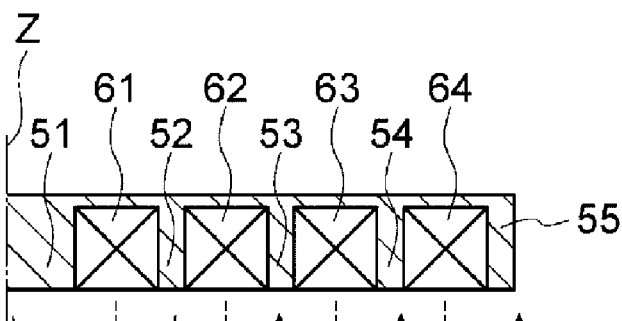
FIGS. 14A to 14D illustrate examples of a magnetic field generated by the electromagnet.
Figure 14B:
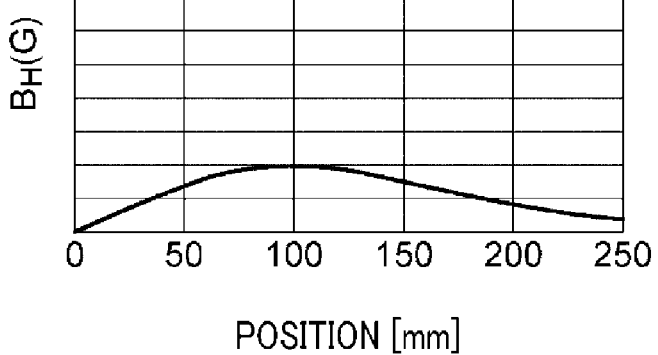
Figure 14C:
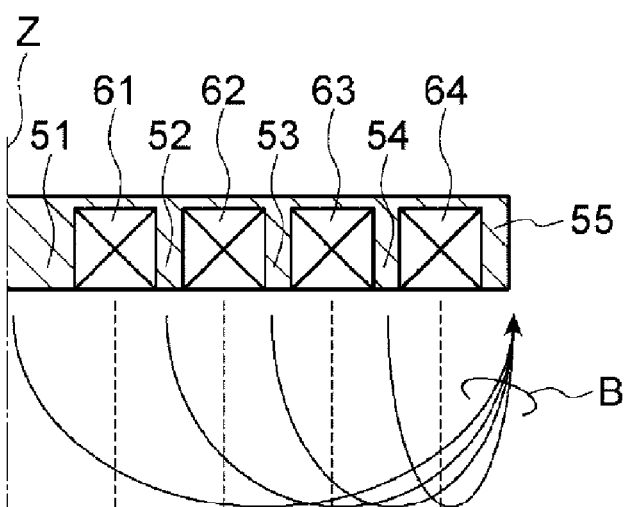
Figure 14D:
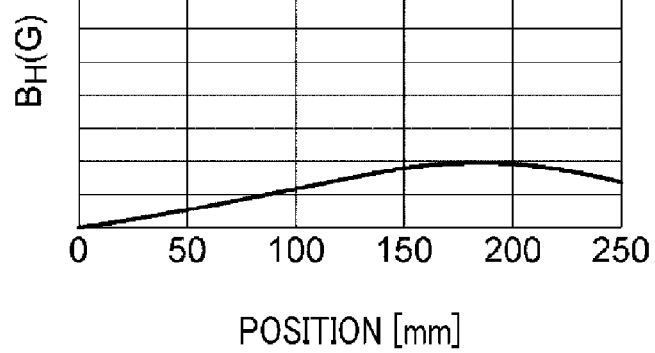

In the electromagnet 30A, by supplying a current into one or more of the coils 61 to 64, a magnetic field B having horizontal magnetic field components $B_H$ in a radial direction with respect to the central axis line Z can be generated within the processing space S. FIGS. 14A to 14D illustrate examples of a magnetic field generated by the electromagnet 30A. FIG. 14A illustrates a magnetic field B when a current is supplied to the coil 62 and a cross section of the electromagnet 30A in a half plane with respect to the central axis line Z, and FIG. 14B illustrates an intensity distribution of the horizontal magnetic field components $B_H$ when a current is supplied to the coil 62. Further, FIG. 14C illustrates a magnetic field B when a current is supplied to the coil 64 and a cross section of the electromagnet 30A in a half plane with respect to the central axis line Z, and FIG. 14D illustrates an intensity distribution of the horizontal magnetic field components $B_H$ when a current is supplied to the coil 64. In the graphs shown in FIGS. 14B and 14D, horizontal axes represent positions in a radial direction from the central axis line Z when a position of the central axis line Z is set to be about 0 mm, and longitudinal axes represent intensities (magnetic flux densities) of the horizontal magnetic field components $B_H$.

When a current is supplied to the coil 62 of the electromagnet 30A, the magnetic field B as shown in FIG. 14A is generated. That is, there is generated the magnetic field B toward end portions of the cylindrical members 53 to 55 at the processing space S side from end portions of the column-shaped member 51 and the cylindrical member 52 at the processing space S side. An intensity distribution of the horizontal magnetic field components $B_H$ in a radial direction of the magnetic field B has a peak value under a center of the coil 62 as shown in FIG. 14B. In an example, a position of the center of the coil 62 is about 100 mm away from the central axis line Z. When the wafer W having a diameter of about 300 mm is processed, the position of the center of the coil 62 is an intermediate position between a center and an edge of a wafer W in a radial direction. Therefore, the magnetic field B generated by supplying a current to the coil 62 can be used at block S2.

Further, if a current is supplied to the coil 64 of the electromagnet 30A, the magnetic field B as shown in FIG. 14C is generated. That is, there is generated the magnetic field B toward an end portion of the cylindrical member 55 at the processing space S side from end portions of the column-shaped member 51 and the cylindrical members 52 to 54 at the processing space S side. An intensity distribution of the horizontal magnetic field components $B_H$ in a radial direction of the magnetic field B has a peak value under a center of the coil 64 as shown in FIG. 14D. In an example, a position of the center of the coil 64 is about 200 mm away from the axis line Z. When the wafer W having a diameter of about 300 mm is processed, the position of the center of the coil 64 is an outer position of an edge of a wafer W in a radial direction. Therefore, the magnetic field B generated by supplying a current to the coil 64 can be used at blocks S1 and S3.

EXPERIMENTAL EXAMPLES 1 TO 3 AND COMPARATIVE EXPERIMENTAL EXAMPLES 1 TO 3

Hereinafter, there will be explained experimental examples 1 to 3 and comparative experimental examples 1 to 3 carried out by using the plasma processing apparatus 10A. In the experimental example 1, at block S1, an oxide film uniformly formed on a substrate having a diameter of about 300 mm is etched in the plasma processing apparatus 10A. Conditions of the experimental example 1 are as follows.

Conditions of Experimental Example 1

High frequency power: 100 MHz, 1000 W
High frequency bias power: 3.2 MHz, 300 W
Pressure in processing space: 15 mTorr (2 Pa)
Processing gas: $CHF_3$ (500 sccm), $O_2$ (10 sccm)
Coil to which current is supplied: coil 64

Further, for comparison, there is performed the comparative experimental example 1 which is different from the experimental example 1 in that a magnetic field is not generated by the electromagnet 30A.

In the experimental example 2, at block S2, an organic film uniformly formed on a substrate having a diameter of 300 mm is etched in the plasma processing apparatus 10A. Conditions of the experimental example 2 are as follows.

Conditions of Experimental Example 2

High frequency power: 100 MHz, 2400 W
High frequency bias power: 3.2 MHz, 200 W
Pressure in processing space: 30 mTorr (4 Pa)

Processing gas: $N_2$ (45 sccm), $O_2$ (22 sccm), $CH_4$ (180 sccm)

Coil to which current is supplied: coil 62

Moreover, for comparison, there is performed the comparative experimental example 2 which is different from the experimental example 2 in that a magnetic field is not generated by the electromagnet 30A.

In the experimental example 3, at block S3, an oxide film uniformly formed on a substrate having a diameter of 300 mm is etched in the plasma processing apparatus 10A. Conditions of the experimental example 3 are as follows. A value of a current supplied to the coil 64 in the experimental example 3 is set to be higher than a value of a current supplied to the coil 64 in the experimental example 1.

Conditions of Experimental Example 3

High frequency power: 100 MHz, 1000 W
High frequency bias power: 3.2 MHz, 5800 W
Pressure in processing space: 15 mTorr (2 Pa)
Processing gas: $C_4F_8$ (130 sccm), Ar (100 sccm), $O_2$ (40 sccm)

Coil to which current is supplied: coil 64

Further, for comparison, there is performed the comparative experimental example 3 which is different from the experimental example 3 in that a magnetic field is not generated by the electromagnet 30A.

Figure 15:
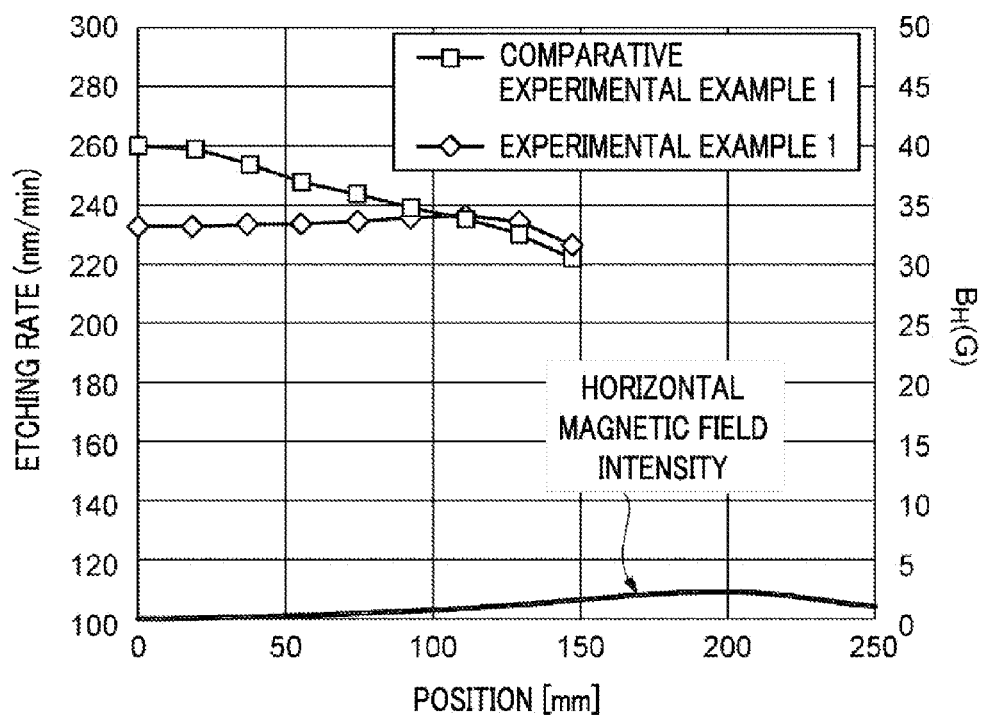
FIG. 15 illustrates results of an experimental example 1 and a comparative experimental example 1.
Figure 16:
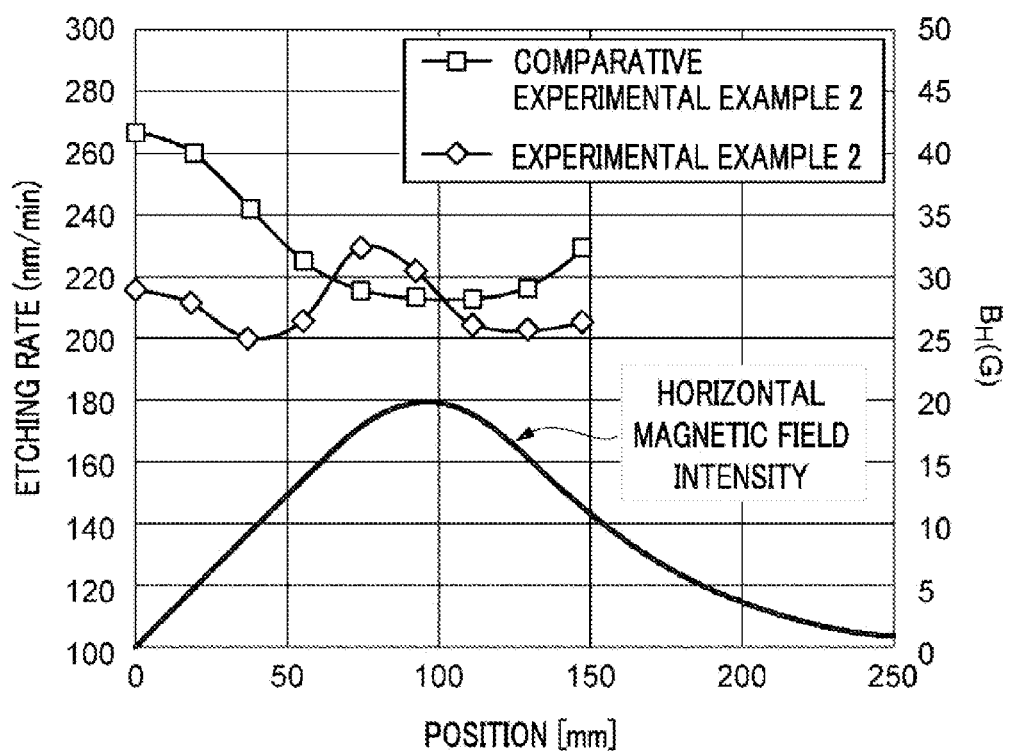
FIG. 16 illustrates results of an experimental example 2 and a comparative experimental example 2.
Figure 17:
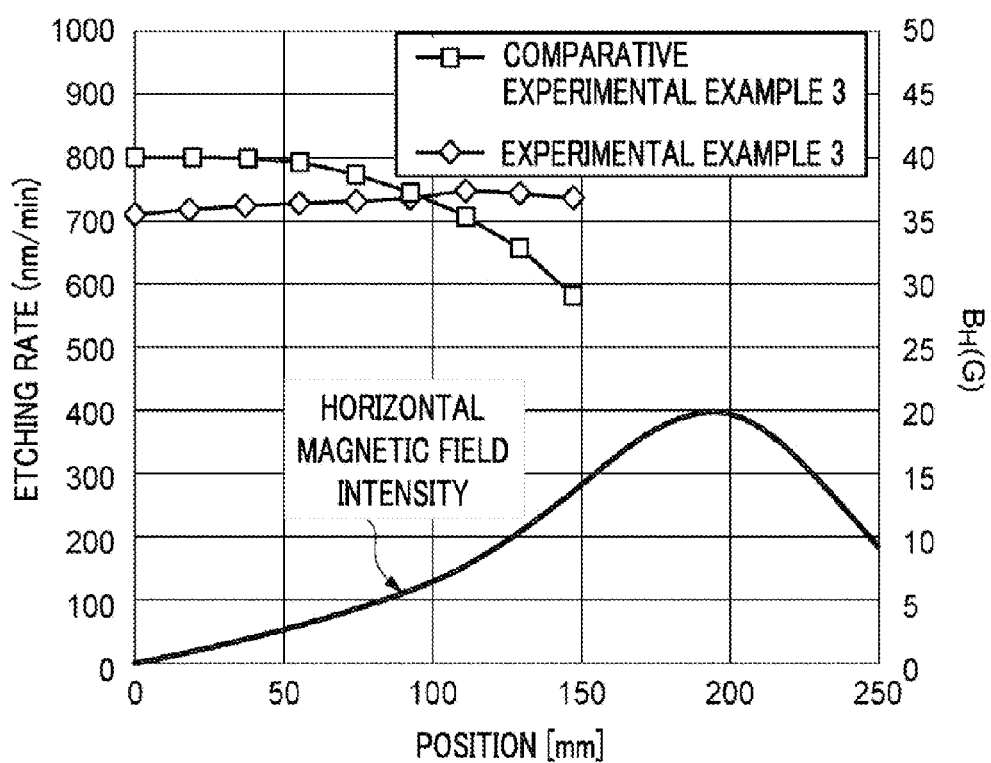
FIG. 17 illustrates results of an experimental example 3 and a comparative experimental example 3.

In the experimental example 1 and the comparative experimental example 1, film thicknesses of the oxide films before and after performing the processes are measured at multiple positions in a radius of the substrate, and etching rates at the multiple positions are obtained, respectively. Further, in the experimental example 2 and the comparative experimental example 2, film thicknesses of the organic films before and after performing the processes are measured at multiple positions in a radius of the substrate, and etching rates at the multiple positions are obtained, respectively. Furthermore, in the experimental example 3 and the comparative experimental example 3, film thicknesses of the oxide films before and after performing the processes are measured at multiple positions in a radius of the substrate, and etching rates at the multiple positions are obtained, respectively. A distribution of the etching rates obtained in each of the experimental example 1 and the comparative experimental example 1 is shown in FIG. 15; a distribution of the etching rates obtained in each of the experimental example 2 and the comparative experimental example 2 is shown in FIG. 16; and a distribution of the etching rates obtained in each of the experimental example 3 and the comparative experimental example 3 is shown in FIG. 17. In FIG. 15 to FIG. 17, horizontal axes represent positions in a radius of the substrate when a center location of the substrate is set to be about 0 mm. Further, longitudinal axes on the left represent etching rates, and longitudinal axes on the right represent intensities (magnetic flux densities) of horizontal magnetic field components $B_H$. In FIG. 15 to FIG. 17, intensity distributions of horizontal magnetic field components $B_H$ obtained by simulating the experimental examples 1 to 3 are also shown.

As shown in FIG. 15, in the comparative experimental example 1, a magnetic field is not generated by the electromagnet 30A. Therefore, it is observed that the etching rate of the oxide film tends to be decreased as closer to the edge of the substrate due to the effect of the plasma density distribution. That is, in the comparative experimental example 1, non-uniformity of the etching rate distribution of the oxide film in a diametric direction is observed. Meanwhile, in the experimental example 1, i.e. when a magnetic field having horizontal magnetic field components, which have a peak intensity at an outer position of the edge of the substrate in a radial direction, is generated by supplying a current to the coil 64, the non-uniformity of the etching rate distribution of the oxide film in a diametric direction is reduced.

Further, as shown in FIG. 16, in the comparative experimental example 2, a magnetic field is not generated by the electromagnet 30A. Therefore, it is observed that an etching rate of the organic film tends to be decreased as closer to the edge of the substrate due to the effect of the plasma density distribution. That is, in the comparative experimental example 2, non-uniformity of the etching rate distribution of the organic film in a diametric direction is observed. Meanwhile, in the experimental example 2, i.e. when a magnetic field having horizontal magnetic field components, which have a peak intensity at an intermediate position between the center and the edge of the substrate in a radial direction, is generated by supplying a current to the coil 62, the non-uniformity of the etching rate distribution of the organic film in a diametric direction is reduced.

Furthermore, as shown in FIG. 17, in the comparative experimental example 3, a magnetic field is not generated by the electromagnet 30A. Therefore, it is observed that the etching rate of the oxide film tends to be decreased as closer to the edge of the substrate due to the effect of the plasma density distribution. That is, in the comparative experimental example 3, non-uniformity of an etching rate distribution of the oxide film in a diametric direction is observed. Meanwhile, in the experimental example 3, i.e. when a magnetic field having horizontal magnetic field components, which have a peak intensity at an outer position of the edge of the substrate in a radial direction, is generated by supplying a current greater than the current of the experimental example 1 to the coil 64, the non-uniformity of an etching rate distribution of the oxide film in a diametric direction is reduced.

Although various example embodiments and experimental examples thereof have been explained, the present disclosure is not limited to the above-described example embodiments and various modifications can be made. By way of example, although the method in accordance with the above-described example embodiments is an etching method of the multilayer film including the first oxide film, the organic film, and the second oxide film, the concept of the present disclosure can be applied to an etching method of a multilayer film including at least a first film and a second film. The first film and the second film may be films layered continuously to each other and may be films having different kinds from each other. Further, any one of the first film and the second film may be an upper layer. That is, any one of the first film and the second film may be etched first. According to the concept of the present disclosure, in a process of etching the first film, plasma is generated by using a high frequency power having a relatively lower value, and in a process of etching the second film, plasma is generated by using a high frequency power having a relatively higher value. Further, in the process of etching the first film and the process of etching the second film, a magnetic field is generated such that horizontal magnetic field components in a radial direction with respect to the central axis line Z have an intensity distribution having a peak value at a position far from the central axis line Z. Furthermore, in the process of etching the second film, a magnetic field is generated such that a position of the peak value of horizontal magnetic field components is closer to the central axis line Z than a position of the peak value of horizontal magnetic field components in the process of the etching the first film. By way of example, in the process of etching the second film, a magnetic field having horizontal magnetic field components, which have a peak intensity at an intermediate position between the center and the edge of the wafer W in a radial direction is generated. Moreover, in the process of etching the first film, a magnetic field having horizontal magnetic field components, which have a peak intensity at an outer position of an edge of the wafer W in a radial direction, is generated. Therefore, it is possible to decrease a gradient of the plasma density distribution in the process of etching the first film and also possible to reduce a gradient of the plasma density distribution in the process of etching the second film. Thus, it is possible to suppress non-uniformity of the etching rate depending on a position when etching each film.

Further, in the above, a frequency of about 100 MHz is provided as an example of a frequency of the high frequency power for plasma generation from the high frequency power supply 18, but a frequency of the high frequency power for plasma generation can be set to be a certain value. By way of example, a frequency of about 40 MHz or more may be set as a frequency of the high frequency power for plasma generation.

Herein, an electric field intensity distribution within the processing space S when a magnetic field is not generated by the electromagnets 30 or 30A and when a high frequency power is applied to any one of the disc-shaped upper electrode and the lower electrode is expressed by the following equation (2) using a zero-order Bessel function (equation (3)), and the electric field intensity distribution expressed by equation (2) reflects a plasma density distribution.

[Equation 2]
$$E = E_0 e^{j\omega t} J_0\left(\frac{\omega r}{c}\right) \quad (2)$$

[Equation 3]
$$J_0(x) = 1 - \frac{1}{1}\left(\frac{x}{2}\right)^2 + \frac{1}{(2)^2}\left(\frac{x}{2}\right)^4 - \frac{1}{(3)^2}\left(\frac{x}{2}\right)^6 + \ldots \quad (3)$$

Herein, E represents an electric field intensity distribution, r represents a distance from the central axis line Z in a radial direction, c represents a speed of light, ω represents an angular frequency of a high frequency power, and $E_0$ represents a certain value of electric field intensity.

Figure 18A:
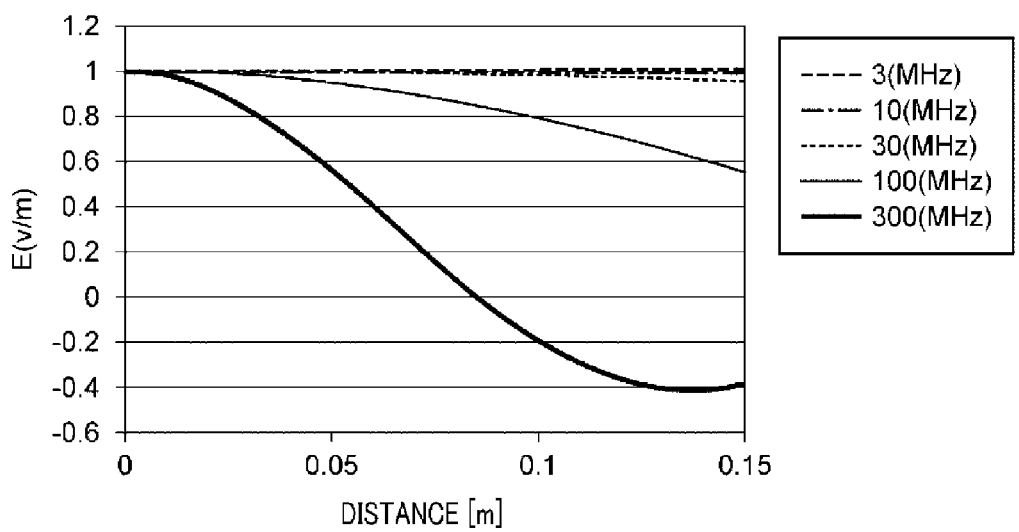
FIGS. 18A and 18B illustrate electric field intensity distributions in the processing space.
Figure 18B:
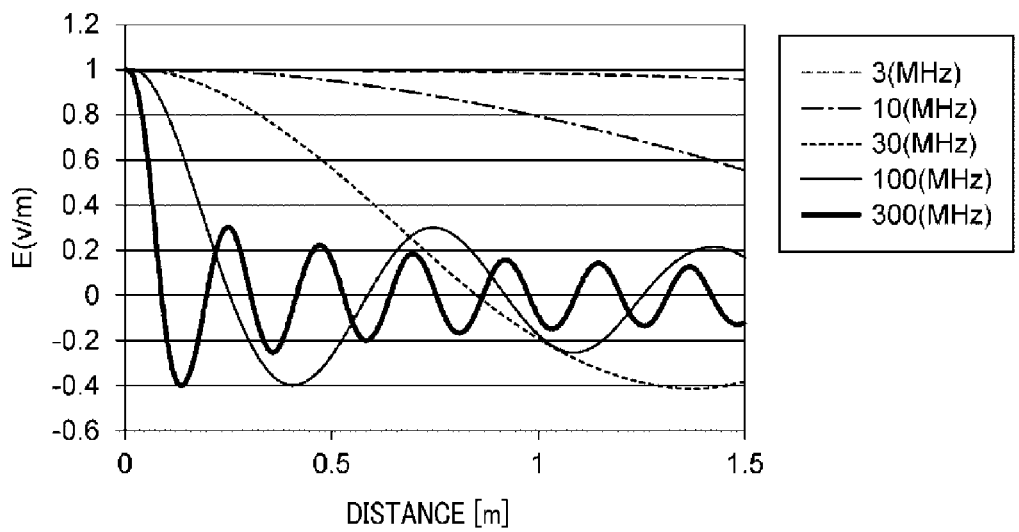

The electric field intensity distribution within the processing space S expressed by equation (2) is shown in FIGS. 18A and 18B. In FIGS. 18A and 18B, an electric field intensity distribution in each case where a frequency of the high frequency power is about 3 MHz, about 10 MHz, about 30 MHz, about 100 MHz, or about 300 MHz is expressed as a function of the distance from the central axis line Z in a radial direction. In FIGS. 18A and 18B, horizontal axes represent distances when a position of the central axis line Z is set to be about 0 mm, and longitudinal axes represent electric field intensity. Further, FIG. 18A illustrates an electric field intensity distribution in a range of about 0.15 m from the central axis line Z, and FIG. 18B illustrates an electric field intensity distribution in a range of about 1.5 m from the central axis line Z.

As shown in FIGS. 18A and 18B, there is a difference in the electric field intensity distributions from the central axis line Z in a radial direction within the processing space S depending on a frequency of the high frequency power for plasma generation. However, regardless of a frequency of the high frequency power for plasma generation, the electric field intensity distribution has a gradient in which the electric field intensity is high at the central axis line Z and is decreased as farther from the central axis line Z. Therefore, the effect of reducing non-uniformity of the plasma density distribution by generating a magnetic field having horizontal magnetic field components within the processing space S in accordance with the example embodiments can be achieved regardless of a frequency of the high frequency power for plasma generation. In other words, a frequency of the high frequency power for plasma generation used in the above-described example embodiments is not limited.

Further, in the above, a diameter of about 300 mm is provided as an example of a diameter of the wafer W, but a diameter of the wafer W may be smaller or greater than 300 mm. By way of example, the above-described example embodiments can be applied to a wafer W having a diameter of about 450 mm.

Herein, as can be seen clearly from the electric field intensity distributions shown in FIGS. 18A and 18B, even when a high frequency power for plasma generation having a relatively low frequency of about 30 MHz is used, if the wafer W has a greater diameter of about 450 mm, non-uniformity of a plasma density distribution is not ignorable. That is, if a diameter of the wafer W is increased, even when a high frequency power for plasma generation having a relatively low frequency is used, a difference between a plasma density right above the center of the wafer W and a plasma density right above the edge of the wafer W is not ignorable. Therefore, the effect of reducing non-uniformity of the plasma density distribution by generating a magnetic field having horizontal magnetic field components within the processing space in accordance with the example embodiments can be achieved regardless of a diameter of the wafer W. In other words, a diameter of the wafer W to which the above-described example embodiments can be applied is not limited.

Furthermore, in the above-described example embodiments, the electromagnet is used to generate a magnetic field, but a permanent magnet may be used instead of the electromagnet. Moreover, in the above-described example embodiments, the electromagnet is provided on the upper electrode 16, but the electromagnet may be arranged at any position as long as it can generate a magnetic field having the above-described horizontal magnetic field components within the processing space S.

Figure 19:
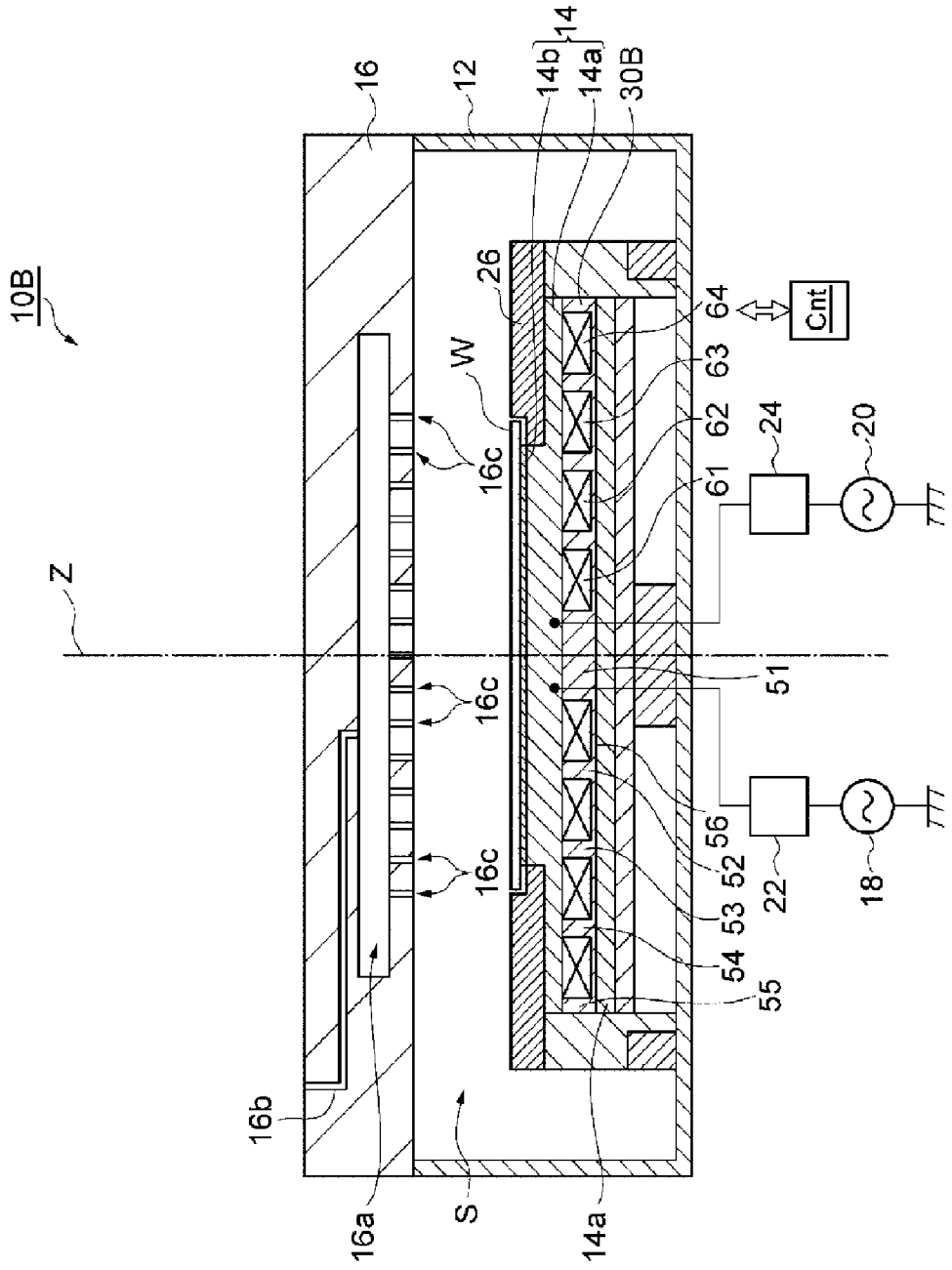
FIG. 19 is a schematic cross sectional view of a plasma processing apparatus in accordance with a third example embodiment.

By way of example, in the example embodiments shown in FIG. 12, the electromagnet 30A is provided on the upper electrode 16. However, as depicted in FIG. 19, an electromagnet 30B which is the same as the electromagnet 30A may be provided within the base member 14a. Further, in a plasma processing apparatus 10B depicted in FIG. 19, a direction of the electromagnet 30B is reversed from the direction of the electromagnet 30A such that the column-shaped member 51 and the cylindrical members 52 to 55 of the electromagnet 30B are positioned on the base member 56.

Figure 20:
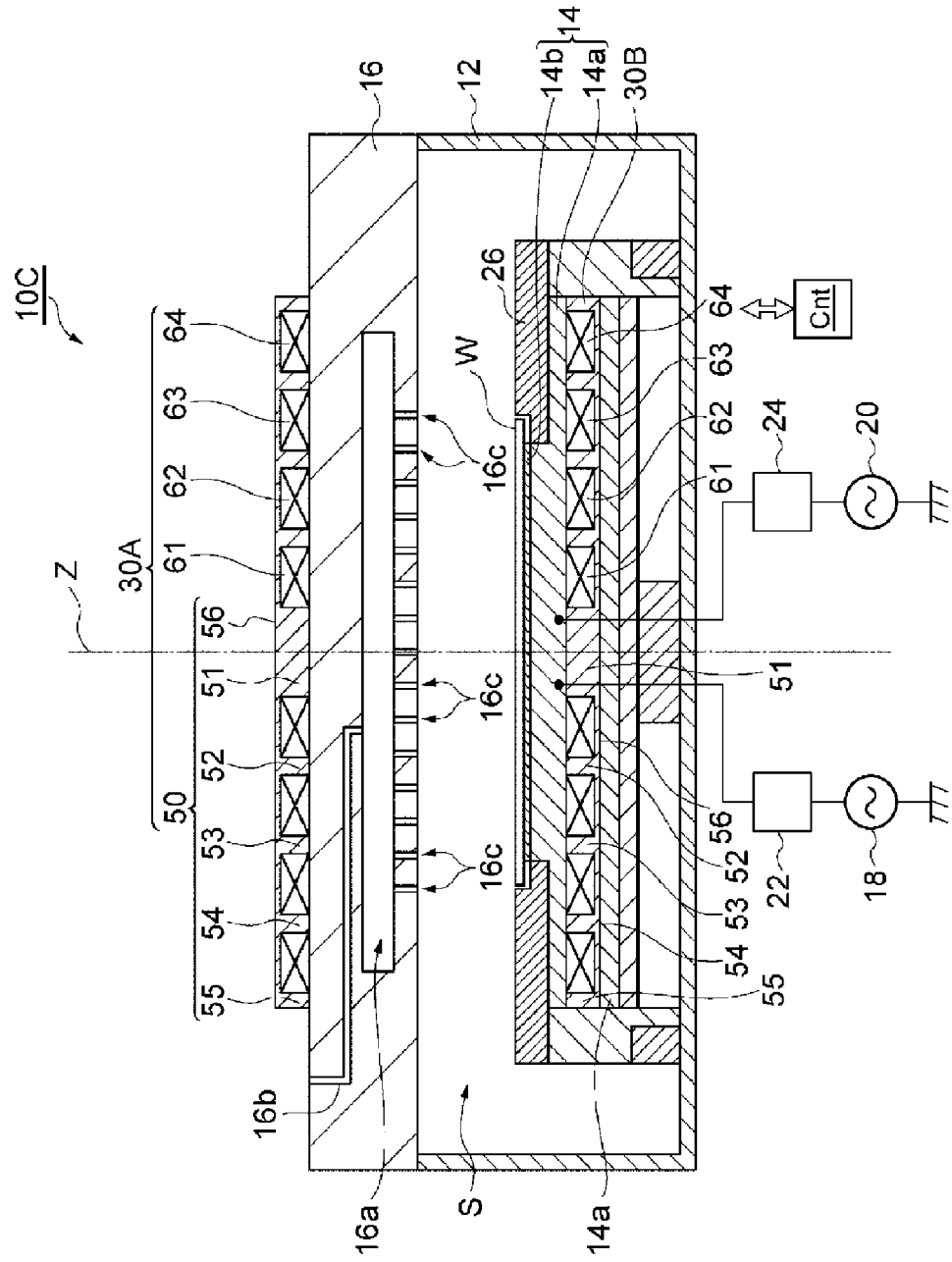
FIG. 20 is a schematic cross sectional view of a plasma processing apparatus in accordance with a fourth example embodiment.

Further, by way of example, as depicted in FIG. 20, multiple electromagnets each of which is the same as the electromagnet 30A may be provided. In a plasma processing apparatus 10C depicted in FIG. 20, the electromagnet 30A is provided on the upper electrode 16 and the electromagnet 30B is provided within the base member 14a. Positions of electromagnets and the number of the electromagnets can be optionally selected. Further, the upper electrode 16 or the base member 14a can be made of aluminum. The upper electrode or the base member 14a scarcely affects a magnetic field generated by the electromagnets.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An etching method of a multilayer film including a first oxide film, a second oxide film, and an organic film formed between the first oxide film and the second oxide film in a plasma processing apparatus, the etching method comprising:

etching the first oxide film by generating plasma of a first processing gas in a processing space of the plasma processing apparatus in which a target object having the multilayer film and a resist mask formed on the first oxide film is accommodated;

etching the organic film by generating plasma of a second processing gas in the processing space after the etching of the first oxide film; and etching the second oxide film by generating plasma of a third processing gas in the processing space after the etching of the organic film, wherein each of the plasma of the first processing gas, the plasma of the second processing gas, and the plasma of the third processing gas is generated by applying a high frequency power to one of a lower electrode serving as a mounting table configured to mount thereon the target object and an upper electrode provided above the lower electrode, the high frequency power in the etching of the organic film is set to be higher than the high frequency power in the etching of the first oxide film and the high frequency power in the etching of the second oxide film, in each of the etching of the first oxide film, the etching of the organic film, and the etching of the second oxide film, a high frequency bias power is applied to the lower electrode, the high frequency bias power in the etching of the first oxide film and the high frequency bias power in the etching of the second oxide film are set to be higher than the high frequency bias power in the etching of the organic film, in each of the etching of the first oxide film, the etching of the organic film, and the etching of the second oxide film, a magnetic field is generated such that horizontal magnetic field components in a radial direction with respect to a central axis line of the target object have an intensity distribution having a peak value at a position far from the central axis line, and a position of the peak value of the horizontal magnetic field components in the etching of the organic film is closer to the central axis line than a position of the peak value of the horizontal magnetic field components in the etching of the first oxide film and a position of the peak value of the horizontal magnetic field components in the etching of the second oxide film.

2. The etching method of claim 1, wherein a thickness of the second oxide film is greater than a thickness of the first oxide film, the high frequency bias power in the etching of the second oxide film is higher than the high frequency bias power in the etching of the first oxide film, and intensity of the horizontal magnetic field components in the etching of the second oxide film is higher than intensity of the horizontal magnetic field components in the etching of the first oxide film.

3. The etching method of claim 1, wherein, in the etching of the organic film, a position of a peak intensity of the horizontal magnetic field components is an intermediate position between a center of the target object and an edge of the target object in the radial direction.

4. The etching method of claim 1, wherein, in the etching of the first oxide film and the etching of the second oxide film, a position of a peak intensity of the horizontal magnetic field components is an outer position of an edge of the target object in the radial direction.

5. An etching method of a multilayer film including a first film and a second film, the etching method comprising:

etching the first film by generating plasma of a processing gas in a processing space of a plasma processing apparatus in which a target object having the multilayer film is accommodated; and etching the second film by generating plasma of a processing gas in the processing space, wherein each of the plasma of the processing gas generated in the etching of the first film and the plasma of the processing gas generated in the etching of the second film is generated by applying a high frequency power to one of a lower electrode serving as a mounting table configured to mount thereon the target object and an upper electrode provided above the lower electrode, the high frequency power in the etching of the second film is set to be higher than the high frequency power in the etching of the first film, in each of the etching of the first film and the etching of the second film, a high frequency bias power is applied to the lower electrode, the high frequency bias power in the etching of the first film is set to be higher than the high frequency bias power in the etching of the second film, in each of the etching of the first film and the etching of the second film, a magnetic field is generated such that horizontal magnetic field components in a radial direction with respect to a central axis line of the target object have an intensity distribution having a peak value at a position far from the central axis line, and a position of the peak value of the horizontal magnetic field components in the etching of the second film is closer to the central axis line than a position of the peak value of the horizontal magnetic field components in the etching of the first film.

6. The etching method of claim 5, wherein in the etching of the second film, a position of a peak intensity of the horizontal magnetic field components is an intermediate position between a center of the target object and an edge of the target object in the radial direction.

7. The etching method of claim 5, wherein in the etching of the first film, a position of a peak intensity of the horizontal magnetic field components is an outer position of an edge of the target object in the radial direction.

* * * * *

UNITED STATES PATENT AND TRADEMARK OFFICE
CERTIFICATE OF CORRECTION

PATENT NO.       : 8,895,454 B2                       Page 1 of 1
APPLICATION NO.  : 14/158981
DATED            : November 25, 2014
INVENTOR(S)      : Shinji Himori et al.

It is certified that error appears in the above-identified patent and that said Letters Patent is hereby corrected as shown below:

On the Title Page, after Related U.S. Application Data section; Please add the following:

(30)        Foreign Application Priority Data

Jan. 21, 2013  (JP) ................................................ 2013-008504
Mar. 27, 2013  (JP) ................................................ 2013-066465

In the Specification

Column 5, line 46; Please delete "1013" and add -- 10B --

Column 12, line 40; Please delete "1013" and add -- 10B --

Column 12, line 42; Please delete "1013" and add -- 10B --

Column 13, line 29; Please delete "51" and add -- S1 --

Signed and Sealed this
Thirteenth Day of October, 2015

Michelle K. Lee
*Director of the United States Patent and Trademark Office*